US010034366B2

(12) United States Patent
Gailus et al.

(10) Patent No.: US 10,034,366 B2
(45) Date of Patent: Jul. 24, 2018

(54) MATING BACKPLANE FOR HIGH SPEED, HIGH DENSITY ELECTRICAL CONNECTOR

(71) Applicant: Amphenol Corporation, Wallingford, CT (US)

(72) Inventors: Mark W. Gailus, Concord, MA (US); Marc B. Cartier, Jr., Dover, NH (US); Vysakh Sivarajan, Nashua, NH (US); David Levine, Amherst, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 15/792,953

(22) Filed: Oct. 25, 2017

(65) Prior Publication Data

US 2018/0049312 A1    Feb. 15, 2018

Related U.S. Application Data

(63) Continuation of application No. 14/947,166, filed on Nov. 20, 2015, now Pat. No. 9,807,869.
(Continued)

(51) Int. Cl.
*H05K 1/02* (2006.01)
*H05K 1/11* (2006.01)
(Continued)

(52) U.S. Cl.
CPC ......... *H05K 1/0222* (2013.01); *H01R 43/205* (2013.01); *H05K 1/025* (2013.01);
(Continued)

(58) Field of Classification Search
CPC ......... H05K 1/11; H05K 1/115; H05K 1/0222
See application file for complete search history.

(56) References Cited

U.S. PATENT DOCUMENTS 4,632,476 A   12/1986 Schell
4,806,107 A    2/1989 Arnold et al.
(Continued)

FOREIGN PATENT DOCUMENTS

CN    1918952 A    2/2007
JP    2002-531960 A    9/2002
(Continued)

OTHER PUBLICATIONS

U.S. Appl. No. 15/452,096, filed Mar. 7, 2017, Charbonneau et al.
(Continued)

*Primary Examiner* — Jeremy C Norris
(74) *Attorney, Agent, or Firm* — Wolf, Greenfield & Sacks, P.C.

(57) ABSTRACT

A printed circuit board includes a plurality of layers including attachment layers and routing layers; and via patterns formed in the plurality of layers, each of the via patterns including first and second signal vias forming a differential signal pair, the first and second signal vias extending through at least the attachment layers; ground vias extending through at least the attachment layers, the ground vias including ground conductors; and shadow vias located adjacent to each of the first and second signal vias, wherein the shadow vias are free of conductive material in the attachment layers. The printed circuit board may further include slot vias extending through the attachment layers and located between via patterns.

20 Claims, 27 Drawing Sheets

Related U.S. Application Data

(60) Provisional application No. 62/190,590, filed on Jul. 9, 2015, provisional application No. 62/172,849, filed on Jun. 9, 2015, provisional application No. 62/172,854, filed on Jun. 9, 2015, provisional application No. 62/082,905, filed on Nov. 21, 2014.

(51) Int. Cl.
*H05K 3/40* (2006.01)
*H05K 3/00* (2006.01)
*H01R 43/20* (2006.01)

(52) U.S. Cl.
CPC ......... *H05K 1/0216* (2013.01); *H05K 1/0219* (2013.01); *H05K 1/0251* (2013.01); *H05K 1/0298* (2013.01); *H05K 1/115* (2013.01); *H05K 3/0047* (2013.01); *H05K 3/4038* (2013.01); *H05K 2201/07* (2013.01); *H05K 2201/09318* (2013.01); *H05K 2201/09545* (2013.01)

(56) References Cited

U.S. PATENT DOCUMENTS

| | | | |
|---|---|---|---|
| 4,846,727 | A | 7/1989 | Glover et al. |
| 4,975,084 | A | 12/1990 | Fedder et al. |
| 5,038,252 | A | 8/1991 | Johnson |
| 5,066,236 | A | 11/1991 | Broeksteeg |
| 5,429,520 | A | 7/1995 | Morlion et al. |
| 5,429,521 | A | 7/1995 | Morlion et al. |
| 5,433,617 | A | 7/1995 | Morlion et al. |
| 5,433,618 | A | 7/1995 | Morlion et al. |
| 5,484,310 | A | 1/1996 | McNamara et al. |
| 5,496,183 | A | 3/1996 | Soes et al. |
| 5,828,555 | A | 10/1998 | Itoh |
| 6,181,219 | B1 | 1/2001 | Gailus et al. |
| 6,293,827 | B1 | 9/2001 | Stokoe |
| 6,299,438 | B1 | 10/2001 | Sahagian et al. |
| 6,384,341 | B1 | 5/2002 | Rothermel et al. |
| 6,394,822 | B1 | 5/2002 | McNamara |
| 6,503,103 | B1 | 1/2003 | Cohen et al. |
| 6,607,402 | B2 | 8/2003 | Cohen et al. |
| 6,663,442 | B1 | 12/2003 | Helster et al. |
| 6,776,659 | B1 | 8/2004 | Stokoe et al. |
| 7,139,177 | B2 | 11/2006 | Gottlieb |
| 7,163,421 | B1 | 1/2007 | Cohen et al. |
| 7,239,526 | B1 | 7/2007 | Bibee |
| 7,633,766 | B2 | 12/2009 | Regnier et al. |
| 7,645,944 | B2 | 1/2010 | Casher et al. |
| 7,705,246 | B1 | 4/2010 | Pritchard et al. |
| 7,731,537 | B2 | 6/2010 | Amleshi et al. |
| 7,794,278 | B2 | 9/2010 | Cohen et al. |
| 7,819,697 | B2 | 10/2010 | Glover et al. |
| 7,985,097 | B2 | 7/2011 | Gulla |
| 8,080,738 | B2 | 12/2011 | Morgan |
| 8,251,745 | B2 | 8/2012 | Johnescu et al. |
| 8,273,994 | B2 | 9/2012 | Reynov et al. |
| 8,715,006 | B2 | 5/2014 | Jeon |
| 8,841,560 | B1 | 9/2014 | Roberts |
| 8,889,999 | B2 | 11/2014 | Thurairajaratnam et al. |
| 9,202,783 | B1 | 12/2015 | Simpson et al. |
| 9,544,992 | B2 | 1/2017 | Minich |
| 9,585,259 | B1 | 2/2017 | Reynov |
| 9,775,231 | B2 | 9/2017 | Cartier, Jr. |
| 9,807,869 | B2 | 10/2017 | Gailus et al. |
| 9,930,772 | B2 | 3/2018 | Morgan et al. |
| 2002/0179332 | A1 | 12/2002 | Uematsu et al. |
| 2003/0188889 | A1 | 10/2003 | Straub et al. |
| 2004/0115968 | A1 | 6/2004 | Cohen |
| 2004/0150970 | A1 | 8/2004 | Lee |
| 2004/0263181 | A1 | 12/2004 | Ye et al. |
| 2005/0161254 | A1 | 7/2005 | Clink et al. |
| 2005/0201065 | A1 | 9/2005 | Regnier et al. |
| 2005/0202722 | A1 | 9/2005 | Regnier et al. |
| 2006/0090933 | A1 | 5/2006 | Wig et al. |
| 2006/0185890 | A1 | 8/2006 | Robinson |
| 2006/0244124 | A1 | 11/2006 | Ohlsson |
| 2007/0130555 | A1 | 6/2007 | Osaka |
| 2008/0237893 | A1 | 10/2008 | Quach et al. |
| 2008/0283285 | A1 | 11/2008 | Frech et al. |
| 2009/0188711 | A1 | 7/2009 | Ahmad |
| 2010/0307798 | A1 | 12/2010 | Izadian |
| 2011/0062593 | A1 | 3/2011 | Abe et al. |
| 2011/0232955 | A1 | 9/2011 | Morgan |
| 2012/0003848 | A1 | 1/2012 | Casher et al. |
| 2012/0167386 | A1 | 7/2012 | Goergen et al. |
| 2012/0199380 | A1 | 8/2012 | Olsen |
| 2012/0243184 | A1 | 9/2012 | Lee |
| 2012/0252232 | A1 | 10/2012 | Buck et al. |
| 2013/0056255 | A1 | 3/2013 | Biddle et al. |
| 2013/0077268 | A1 | 3/2013 | Brunker et al. |
| 2013/0098671 | A1 | 4/2013 | Thurairajaratnam et al. |
| 2013/0109232 | A1 | 5/2013 | Paniagua |
| 2013/0112465 | A1 | 5/2013 | Duvanenko |
| 2013/0175077 | A1 | 7/2013 | Kim et al. |
| 2013/0199834 | A1 | 8/2013 | De Geest et al. |
| 2013/0215587 | A1 | 8/2013 | Kawai |
| 2013/0330941 | A1 | 12/2013 | Jeon |
| 2014/0004724 | A1 | 1/2014 | Cartier, Jr. et al. |
| 2014/0182891 | A1 | 7/2014 | Rengarajan et al. |
| 2014/0197545 | A1 | 7/2014 | Chase et al. |
| 2014/0209370 | A1 | 7/2014 | Minich |
| 2015/0114706 | A1 | 4/2015 | Rose et al. |
| 2016/0150633 | A1 | 5/2016 | Cartier |
| 2016/0150639 | A1 | 5/2016 | Gailus et al. |
| 2016/0150645 | A1 | 5/2016 | Gailus et al. |
| 2016/0183373 | A1 | 6/2016 | Williams et al. |
| 2017/0196079 | A1 | 7/2017 | Morgan et al. |

FOREIGN PATENT DOCUMENTS

| | | |
|---|---|---|
| JP | 2007-142307 A | 6/2007 |
| JP | 2009-059873 A | 3/2009 |
| WO | WO 00/33624 A1 | 6/2000 |
| WO | WO 2014/105435 A1 | 7/2014 |

OTHER PUBLICATIONS

U.S. Appl. No. 15/807,444, filed Nov. 8, 2017, Charbonneau et al.
EP 14745727.9, Oct. 21, 2016, Extended European Search Report
PCT/US2015/061907, Mar. 8, 2016, International Search Report and Written Opinion.
PCT/US2015/061930, Apr. 8, 2016, International Search Report and Written Opinion.
PCT/US2015/061919, Apr. 8, 2016, International Search Report and Written Opinion.
PCT/US2017/021158, May 31, 2017, International Search Report and Written Opinion.
Extended European Search Report for European Application No. 14745727.9 dated Oct. 21, 2016.
International Search Report and Written Opinion dated Mar. 8, 2016 for Application No. PCT/US2015/061907.
International Search Report and Written Opinion dated Apr. 8, 2016 for Application No. PCT/US2015/061930.
International Search Report and Written Opinion dated Apr. 8, 2016 for Application No. PCT/US2015/061919.
International Search Report and Written Opinion dated May 31, 2017 for Application No. PCT/US2017/021158.
[No Author Listed], ExaMAX™ Connector System, press-fit products. FCI Application Specification No. GS-20-0361. Preliminary. Revision 6. Mar. 12, 2014. 25 pages.
[No Author Listed], SFF-8643 Specification for Mini Multilane 12 Gbs 8/4x Unshielded Connector, Rev 2.3. SFF Committee, Jan. 11, 2011, 24 pages.
[No Author Listed], Strada Whisper Connector Daughtercard Footprint. Tyco Electronics, Mar. 24, 2010, 1 page.
[No Author Listed], Strada Whisper High Speed Backplane Connector System. Tyco Electronics. Presentation. Mar. 24, 2010. 15 pages.

(56) References Cited

OTHER PUBLICATIONS

[No Author Listed], Zipline Connector System, http://www.slideshare.net/element14/zipline-connector-system Mar. 10, 2011. Last accessed Oct. 12, 2015. 15 pages.

MATING BACKPLANE FOR HIGH SPEED, HIGH DENSITY ELECTRICAL CONNECTOR

CROSS REFERENCE TO RELATED APPLICATIONS

This application is a continuation of U.S. application Ser. No. 14/947,166 filed Nov. 20, 2015, which claims priority based on Provisional Application No. 62/082,905, filed Nov. 21, 2014, Provisional Application No. 62/172,849, filed Jun. 9, 2015, Provisional Application No. 62/172,854, filed Jun. 9, 2015 and Provisional Application No. 62/190,590, filed Jul. 9, 2015, which are hereby incorporated by reference in their entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughter boards" or "daughter cards," may be connected through the backplane.

A known backplane has the form of a printed circuit board onto which many connectors may be mounted. Conductive traces in the backplane may be electrically connected to signal conductors in the connectors so that signals may be routed between the connectors. Daughter cards may also have connectors mounted thereon. The connectors mounted on a daughter card may be plugged into the connectors mounted on the backplane. In this way, signals may be routed among the daughter cards through the backplane. The daughter cards may plug into the backplane at a right angle. The connectors used for these applications may therefore include a right angle bend and are often called "right angle connectors." Other known connectors include, but are not limited to, orthogonal midplane connectors and midplane-less direct attachment orthogonal connectors.

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughter boards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further affect electrical properties.

Examples of shielding can be found in U.S. Pat. Nos. 4,632,476 and 4,806,107, which show connector designs in which shields are used between columns of signal contacts. These patents describe connectors in which the shields run parallel to the signal contacts through both the daughter board connector and the backplane connector. Cantilevered beams are used to make electrical contact between the shield and the backplane connectors. U.S. Pat. Nos. 5,433,617, 5,429,521, 5,429,520, and 5,433,618 show a similar arrangement, although the electrical connection between the backplane and shield is made with a spring type contact. Shields with torsional beam contacts are used in the connectors described in U.S. Pat. No. 6,299,438. Further shields are shown in U.S. Publication No. 2013/0109232.

Other connectors have the shield plate within only the daughter board connector. Examples of such connector designs can be found in U.S. Pat. Nos. 4,846,727, 4,975,084, 5,496,183, and 5,066,236. Another connector with shields only within the daughter board connector is shown in U.S. Pat. No. 5,484,310. U.S. Pat. No. 7,985,097 is a further example of a shielded connector.

Other techniques may be used to control the performance of a connector. For example, transmitting signals differentially may reduce crosstalk. Differential signals are carried on a pair of conductive paths, called a "differential pair." The voltage difference between the conductive paths represents the signal. In general, a differential pair is designed with preferential coupling between the conductive paths of the pair. For example, the two conductive paths of a differential pair may be arranged to run closer to each other than to adjacent signal paths in the connector. No shielding is desired between the conductive paths of the pair, but shielding may be used between differential pairs. Electrical connectors can be designed for differential signals as well as for single-ended signals. Examples of differential signal electrical connectors are shown in U.S. Pat. Nos. 6,293,827, 6,503,103, 6,776,659, 7,163,421, and 7,794,278.

In an interconnection system, such connectors are attached to printed circuit boards, one of which may serve as a backplanes for routing signals between the electrical connectors and for providing reference planes to which reference conductors in the connectors may be grounded. Typically the backplane is formed as a multi-layer assembly manufactured from stacks of dielectric sheets, sometimes called "prepreg". Some or all of the dielectric sheets may have a conductive film on one or both surfaces. Some of the conductive films may be patterned, using lithographic techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

To make electrical connections to the conductive traces or ground/power planes, holes may be drilled through the printed circuit board. These holes, or "vias", are filled or plated with metal such that a via is electrically connected to one or more of the conductive traces or planes through which it passes.

To attach connectors to the printed circuit board, contact pins or contact "tails" from the connectors may be inserted into the vias, with or without using solder. The vias are sized to accept the contact tails of the connector.

SUMMARY

In some embodiments, a printed circuit board comprises: a plurality of layers including attachment layers and routing layers; signal vias extending through at least the attachment layers, the signal vias including signal conductors; ground vias extending through at least the attachment layers, the ground vias including ground conductors; and slot vias extending through the attachment layers, the slot vias including slot conductors that interconnect the ground planes of two or more of the attachment layers.

In further embodiments, a printed circuit board comprises: a plurality of layers including attachment layers and routing layers; signal vias extending through at least the attachment layers, the signal vias including signal conductors; ground vias extending through at least the attachment layers, the ground vias including ground conductors; and groups of blind plated vias extending through the attachment layers, the blind plated vias including conductors that interconnect ground planes of two or more of the attachment layers.

In further embodiments, a printed circuit board comprises: a plurality of layers including attachment layers and routing layers; and via patterns formed in the plurality of layers, each of the via patterns comprising: first and second signal vias forming a differential signal pair, the first and second signal vias extending through at least the attachment layers; ground vias extending through at least the attachment layers, the ground vias including ground conductors; and shadow vias located adjacent to each of the first and second signal vias, wherein the shadow vias are free of conductive material in the attachment layers.

BRIEF DESCRIPTION OF THE DRAWINGS

For a better understanding of the disclosed technology, reference is made to the accompanying drawings, which are incorporated herein by reference and in which.

DETAILED DESCRIPTION

The inventors have recognized and appreciated that, though substantial focus has been placed on providing improved electrical connectors in order to improve the performance of interconnection systems, at some very high frequencies significant performance improvement may be achieved by inventive designs for printed circuit boards. In accordance with some embodiments, improvements may be achieved by the incorporation of structures to alter the electrical properties of the printed circuit board in a connector footprint. The structures shown and described herein may be utilized in any type of printed circuit board, including but not limited to, backplanes, mother boards, daughter boards, orthogonally mating daughter cards that mate with or without a midplane and daughter cards that mate to a cable.

Those structures, for example, may include conducting structures, extending vertically through the board, in attachment layers of the board, to short together edges of ground planes, which might otherwise be free floating as a result of forming ground clearance around signal conductors. In some embodiments, the structures may be blind vias or blind slots that extend only through a portion of the layers of the board, such as the attachment layers of the board where vias have larger diameters to receive compliant pins or other contact tails from a connector or other component mounted on a surface of the board. In some embodiments, the structures may be vias which are plated or filled with conductive material through some or all of the layers of the printed circuit board. In some embodiments, the vias are not plated or filled with conductive material through some or all of the layers of the printed circuit board, thus forming air holes in the printed circuit board.

Figure 1:
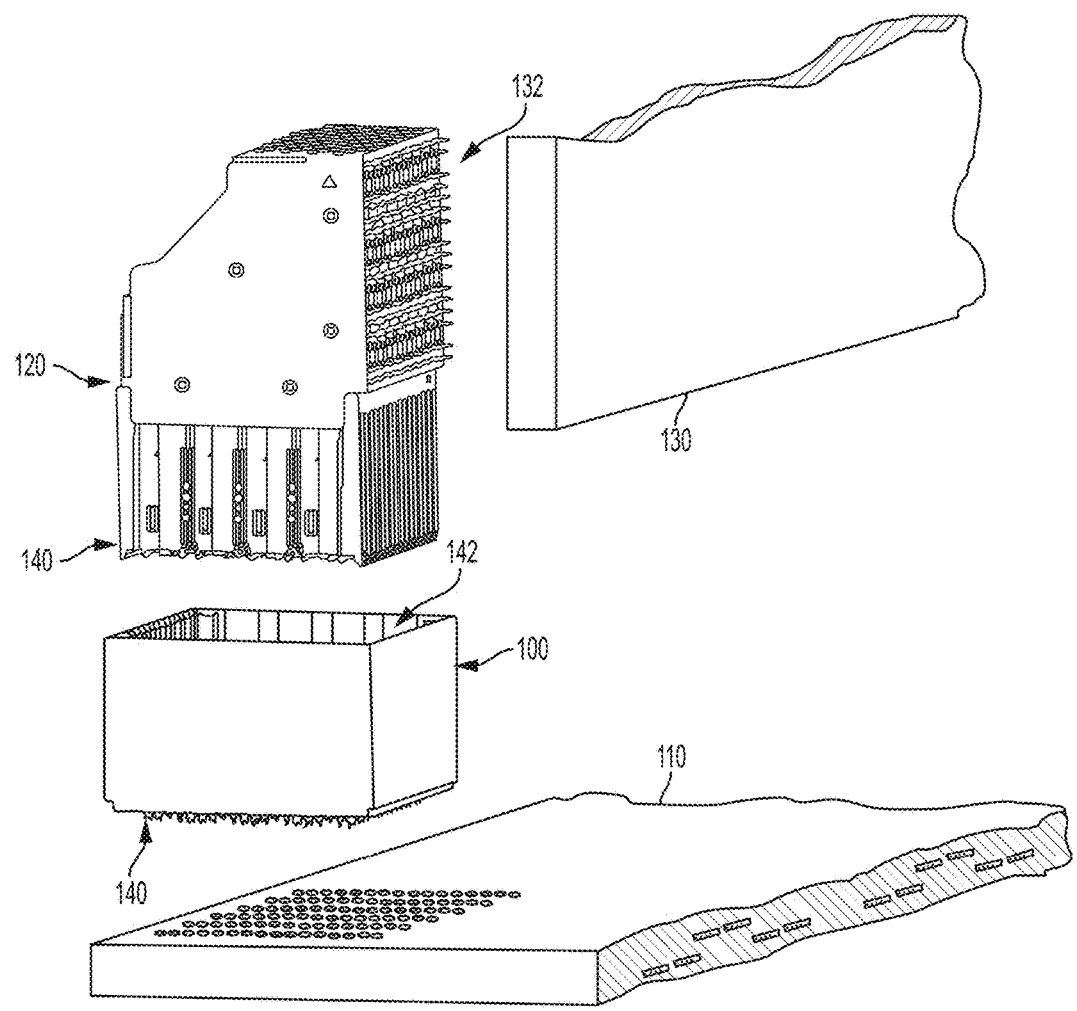
FIG. 1 is an exploded view of a high speed, high density electrical connector, a backplane and a daughter board.

FIG. 1 illustrates an example of an electrical interconnection system of the form that may be used in an electronic system. In this example, the electrical interconnection system includes a right angle connector and may be used, for example, to electrically connect a daughter card to a backplane. Two mating connectors are illustrated in FIG. 1. In this example, a backplane connector 100 is designed to be attached to a backplane 110 and a daughter card connector 120 is designed to be attached to a daughter card 130. Daughter card connector 120 includes contact tails 132 designed to attach to daughter card 130, and backplane connector 100 includes contact tails 140 designed to attach to backplane 110. These contact tails form one end of conductive elements that pass through the interconnection system. When the connectors are mounted to respective circuit boards, the contact tails make electrical connection to conductive structures within the printed circuit boards that carry signals or are connected to a reference potential.

Each of the connectors also has a mating interface where that connector can mate with or be separated from the other connector. Daughter card connector 120 includes a mating interface 140. Backplane connector 100 includes a mating interface 142. Though not fully visible in FIG. 1, mating contact portions of the conductive elements are exposed at the mating interface.

Figure 2:
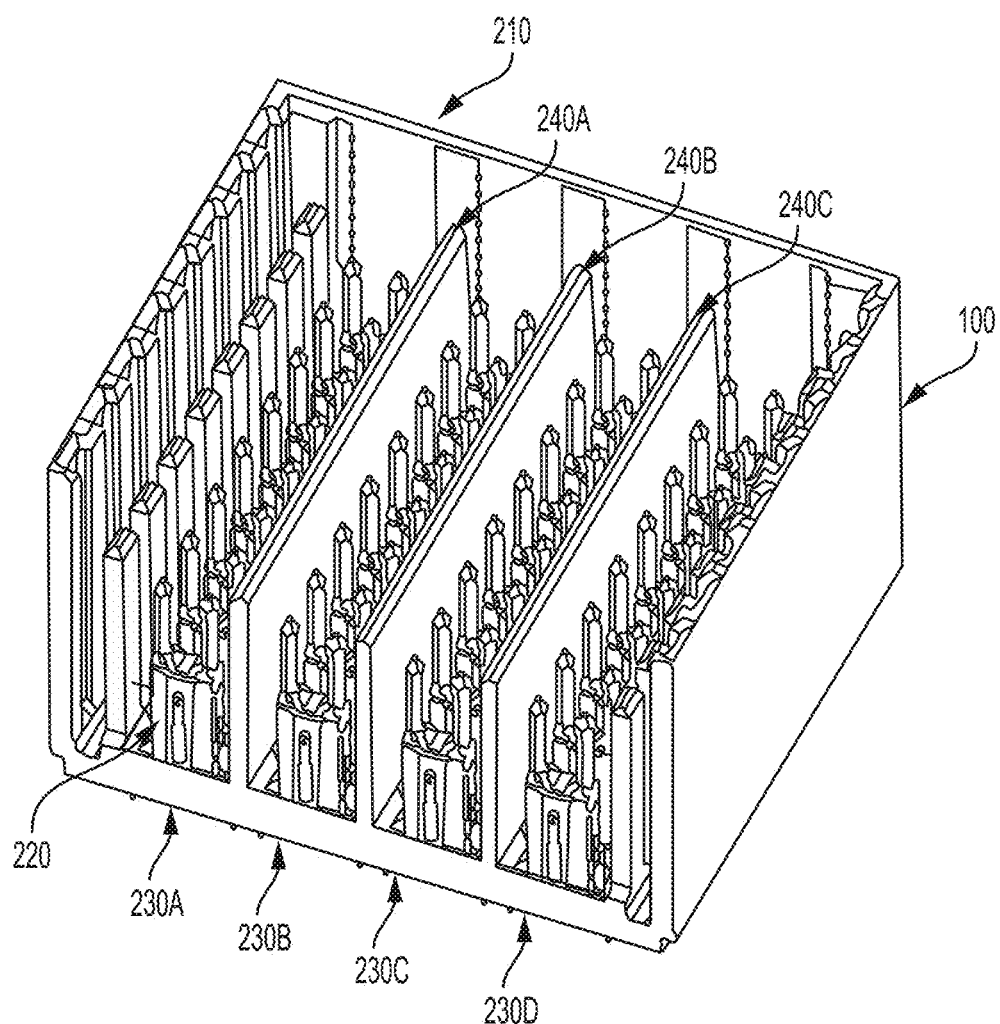
FIG. 2 illustrates a portion of the electrical connector of FIG. 1 which mates with the backplane.

Further details of the construction of the interconnection system of FIG. 1 are provided in FIG. 2, which shows backplane connector 100 partially cut away. In the embodiment of FIG. 2, a forward wall of a housing 210 is cut away to reveal the interior portions of mating interface 142. In the embodiment of FIG. 2, backplane connector 100 has a modular construction. Multiple pin modules 220 are organized to form an array of conductive elements. Each of the pin modules 220 may be designed to mate with a module of daughter card connector 120.

In the embodiment illustrated, four rows and eight columns of pin modules 220 are shown. With each pin module having two signal conductors, four rows 230A, 230B, 230C and 230D of pin modules create columns with four pairs or eight signal conductors, in total. It will be understood, however, that the number of signal conductors per row or column is not a limitation. A greater or lesser number of rows of pin modules 220 may be included within housing 210. Likewise, a greater or lesser number of columns of pin modules 220 may be included within housing 210. Alternatively or additionally, housing 210 may be regarded as a module of a backplane connector, and multiple such modules may be aligned side-to-side to extend the length of a backplane connector.

In the embodiment of FIG. 2, each of the pin modules 220 contains conductive elements which function as signal conductors. Those signal conductors are held within insulative members, which may serve as a portion of the housing 210. The insulated portions of the pin modules 220 may be positioned to separate the signal conductors from other portions of housing 210. In this configuration, other portions of housing 210 may be conductive or partially conductive. Lossy or conductive members may be positioned adjacent to rows 230A, 230B, 230C and 230D of pin modules 220. In the embodiment of FIG. 2, separators 240A, 240B and 240C are provided between adjacent rows of pin modules.

Figure 3:
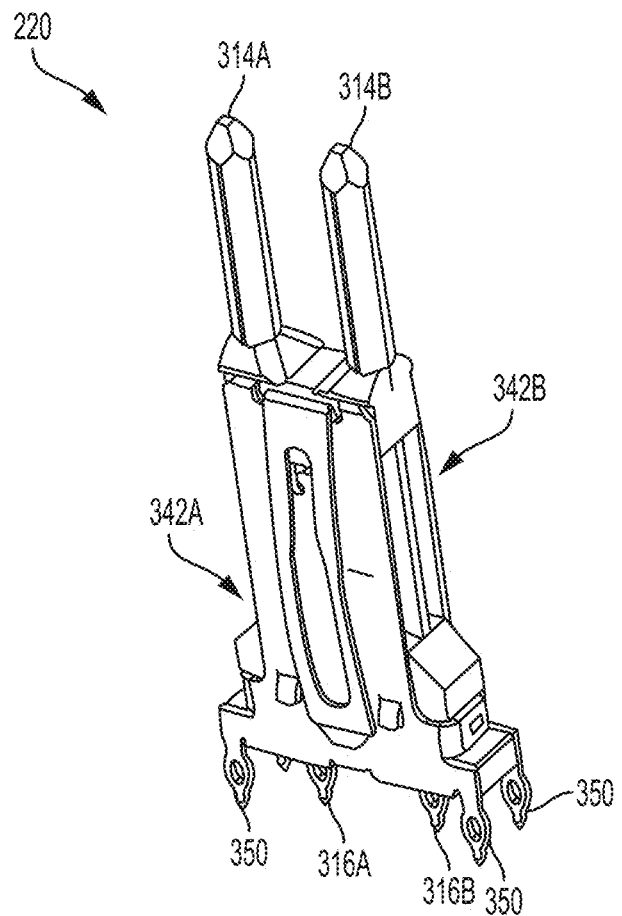
FIG. 3 illustrates a pin module of the electrical connector of FIG. 2.

FIG. 3 illustrates a pin module 220 in greater detail. Each pin module 220 includes a pair of conductive elements acting as signal conductors 314A and 314B. Each of the signal conductors has a mating interface portion shaped as a pin. Opposite ends of the signal conductors have contact tails 316A and 316B for making electrical connections to vias in a printed circuit board, such as backplane 110. In this embodiment, the contact tails are shaped as press-fit compliant sections. Intermediate portions of the signal conductors pass through pin module 220.

Conductive elements serving as reference conductors 342A and 342B are attached at opposite exterior surfaces of pin module 220. Each of the reference conductors has contact tails 350, shaped for making electrical connections to vias in a printed circuit board, such as backplane 110. The reference conductors also have mating contact portions.

Figure 4:
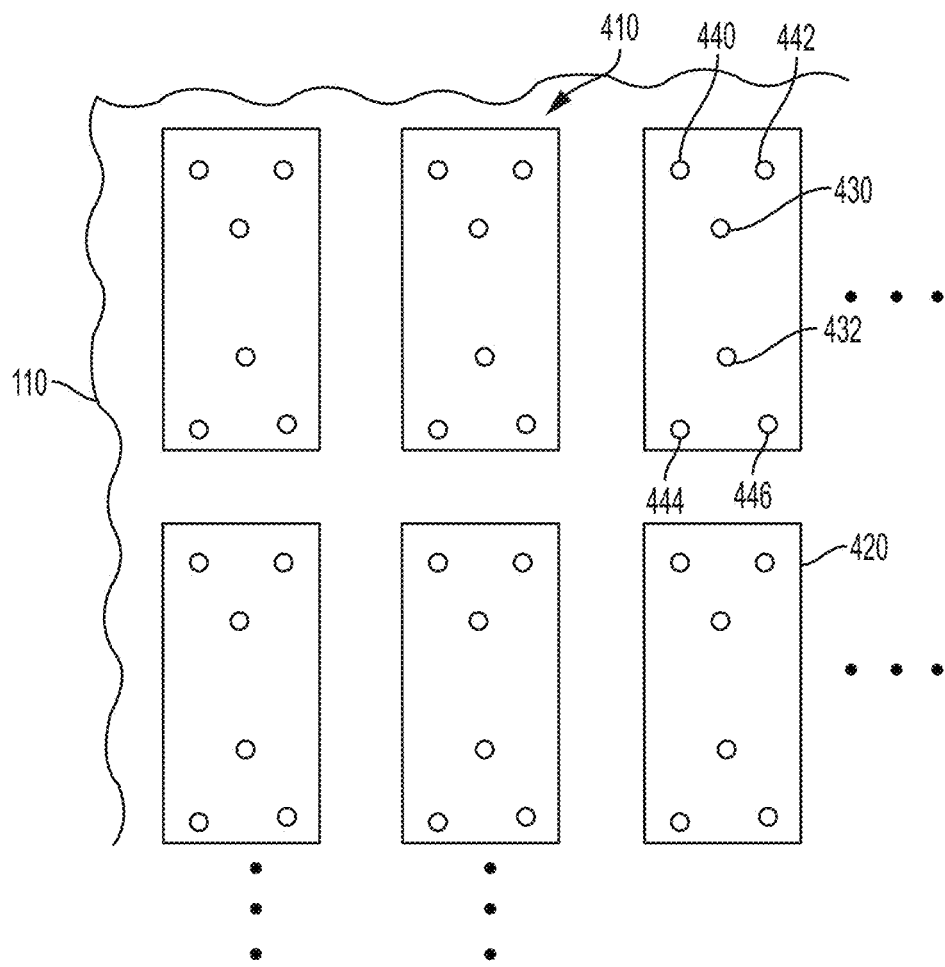
FIG. 4 is a partial top view of a backplane having an array of differential pair connections.

Embodiments of a printed circuit board are described with reference to FIG. 4. A partial top view of backplane 110 showing a connector footprint 410 of vias for mating with the contact tails of backplane connector 100 is shown in FIG. 4. The backplane 110 may be implemented as a printed circuit board as described below. As shown, the connector footprint 410 includes an array of rows and columns of via patterns 420. Each via pattern 420 corresponds to one differential pair of signal conductors and associated reference conductors, as well as other vias not shown in FIG. 4 but described below. As shown, each via pattern 420 includes a first signal via 430 and a second signal via 432, which form a differential signal pair, and ground vias 440, 442, 444 and 446 associated with each pair of signal vias 430, 432. It will be understood that each of the via patterns 420 matches a pattern of contact tails 316A, 316B and 350 of pin module 220 shown in FIG. 3 and described above. Further, the array of via patterns 420 in backplane 110 matches the array of pin modules 220 in backplane connector 100. It will be understood that the parameters of connector footprint 410 may vary, including the number and arrangement of via patterns 420 and the configuration of each via pattern 420, provided that the connector footprint 410 matches the pattern of contact tails in backplane connector 100.

Figure 5:
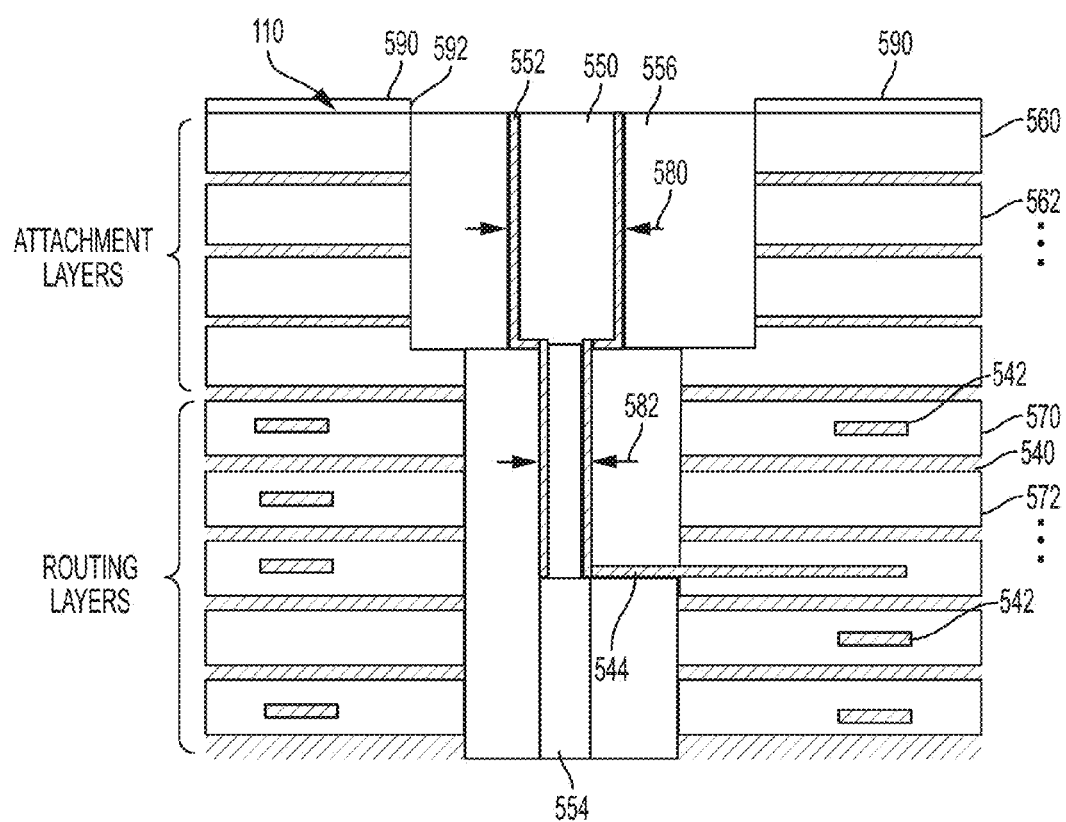
FIG. 5 is a simplified cross-section of a backplane.

Further embodiments of a printed circuit board are described with reference to FIG. 5. A simplified cross-sectional view of a portion of backplane 110 in accordance with embodiments is shown in FIG. 5. The portion shown may be representative of a signal via in a connector footprint. FIG. 5 shows the layered structure of backplane 110 and a signal via 550 for purposes of illustration. It will be understood that an actual backplane 110 includes multiple, closely spaced vias in particular patterns as described below. The backplane 110 may be implemented as a printed circuit board.

As further shown in FIG. 5, the backplane 110 includes multiple layers. Each layer of the multiple layers of backplane 110 may include a conductive layer and a dielectric sheet, so that the backplane 110 includes an alternating arrangement of conductive layers and dielectric sheets. Each conductive layer may serve as a ground plane, may be patterned to form conductive traces, or may include a ground plane and conductive traces in different areas. The layers may be formed, during assembly, by stacking multiple sheets of laminate with patterned copper and prepreg and then pressing them under heat to fuse all the sheets. Patterning the copper may create traces and other conductive structures within the printed circuit board. As a result of fusing, the layers might not be structurally separable in a finished backplane. However, the layers may nonetheless be recognized in the fused structure based on the position of the conductive structures.

The layers may be allocated for different functions and accordingly may have different structural characteristics. In some embodiments, a first portion of the layers, those nearest a surface, may have vias that are wide enough to receive a contact tail from a component mounted to the surface. These layers may be called "attachment layers". A second portion of the layers may have narrower vias, creating wider routing channels. These layers may be called "routing layers."

In the illustrated embodiment, the backplane 110 includes attachment layers 560, 562, etc. and routing layers 570, 572, etc. The attachment layers are located in an upper portion of the backplane 110 and the routing layers are located below the attachment layers. The attachment layers 560, 562, etc. and the routing layers 570, 572, etc. are adhered together to form a single structure in the form of a printed circuit board. The number of attachment layers and the number of routing layers in a particular backplane may vary according to application.

As shown in FIG. 5, backplane 110 may include ground planes 540 between the layers of the structure and may include signal traces 542 in or between the routing layers. A signal trace 544 is shown as connected to signal via 550.

The signal via 550 includes plating 552 in the attachment layers and in one or more of the routing layers. The signal via 550 may be backdrilled in a lower region 554 of backplane 110 to remove the plating. A ground clearance 556 is provided between signal via 550 and the ground planes 540.

As further shown in FIG. 5, the via 550 has a first diameter 580 in the attachment layers and a second diameter 582 in the routing layers. The first diameter 580 is larger than the second diameter 582. In particular, the first diameter 580 is selected to accept a contact tail of the backplane connector 100, and the second diameter 582 is selected in accordance with typical via diameters for printed circuit boards. Because the via 550 has a relatively large first diameter 580 and because the vias are closely spaced to match high density backplane connector 100, little area remains in attachment layers 560, 562, etc. for signal routing. In routing layers 570, 572, etc. which are below the vias of the attachment layers, additional area is available for signal routing.

In some embodiments, the vias may have the same diameter in the attachment layers and in the routing layers. For example, the contact elements of the connector may attach to pads on the surface of the backplane 110 in a surface mount configuration.

In some embodiments, the backplane 110 may include a conductive surface layer 590 on its top surface. The conductive surface layer 590 is patterned to provide an antipad 592, or non-conductive area, around each of the signal vias. The conductive surface layer 590 may be connected to some or all of the ground vias and may provide a contact for a connector ground, such as a conductive gasket or a conductive finger.

Figure 6:
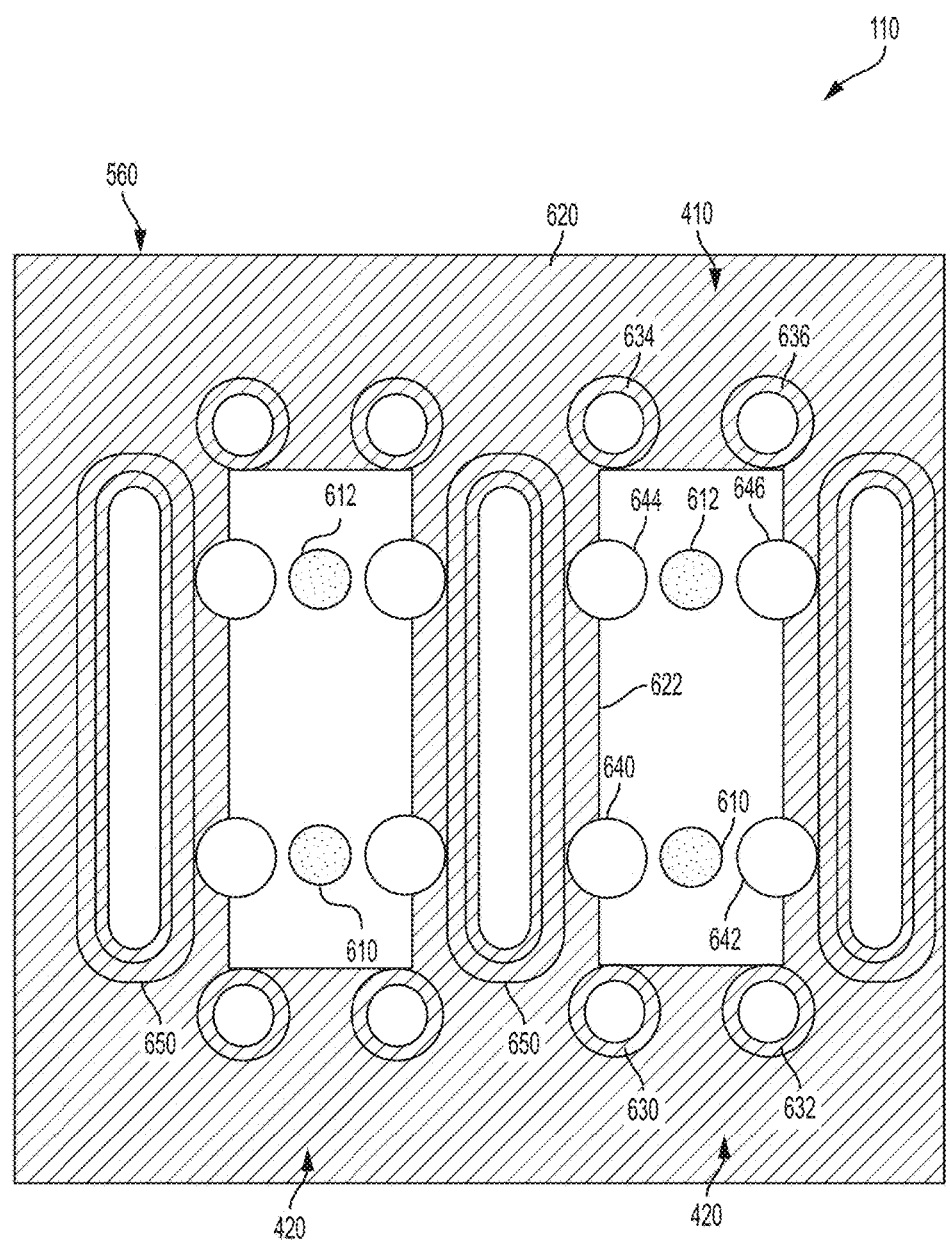
FIG. 6 is a partial top view of an attachment layer of the backplane, in accordance with embodiments.

Further embodiments of a printed circuit board are described with reference to FIGS. 6-12. A partial top view of an embodiment of an attachment layer, such as attachment layer 560, of the backplane 110 is shown in FIG. 6. In the case of multiple attachment layers, each of the attachment layers of backplane 110 may have the same configuration. FIG. 6 shows two via patterns 420 of the connector footprint 410 of backplane connector 100. It should be appreciated that FIG. 6 is partially schematic in that all of the illustrated structures may not in all embodiments be seen in a visual inspection of the top of a printed circuit board. A coating may be placed over the board that obscures some of the structure. In addition, some structures may be formed on layers below the surface of the board. Those layers are nonetheless shown in a top view so that the relative position of structures in the layers may be understood. For example, signal traces and ground planes may not both be visible in the same view of the board, as they are on different vertical planes within the printed circuit board. However, because the relative positioning of signal and ground structures may be important to performance of a printed circuit board, both may be shown in what is referred to as a top view.

In the example illustrated, each via pattern 420 of attachment layer 560 includes a first signal via 610 and a second signal via 612, which form a differential signal pair. The signal vias 610 and 612 extend vertically through the attachment layers and have diameters in attachment layer 560 that are selected to accept the contact tails 140 of backplane connector 100. In forming the board, a ground plane 620 is partially removed, such as by patterning a copper layer on a laminate, to form an antipad 622, forming a ground clearance, surrounding signal vias 610 and 612, so that the dielectric sheet of attachment layer 560 is exposed. The areas where the ground plane is removed may be called "non-conductive areas" or "antipads." The antipad 622 has a size and shape to preclude shorting of ground plane 620 to signal vias 610 and 612, even if there is some imprecision in forming the vias relative to ground plane 620, and to establish a desired impedance of the signal path formed by signal vias 610 and 612. The ground plane 620 is removed around signal vias 610 and 612 and, when the signal vias form a differential signal pair, is removed between signal vias 610 and 612. In the embodiment of FIG. 6, antipad 622 is rectangular in shape, and the signal vias 610 and 612 are centrally located in antipad 622. However, it should be appreciated that the antipad 622 may have any suitable shape, including elliptical, and may have rounded corners.

Each via pattern 420 of attachment layer 560 further includes ground vias 630, 632, 634 and 636 associated with signal vias 610 and 612. The ground vias may be disposed around the signal vias. In this example, ground vias 630 and 632 may be located at one end of the via pattern 420 adjacent to signal via 610, and ground vias 634 and 636 may be located at an opposite end of the via pattern 420 adjacent to signal via 612. The ground vias 630, 632, 634 and 636 may be located more or less in proximity to the respective corners of rectangular antipad 622. The ground vias 630, 632, 634 and 636 are dimensioned to accept corresponding contact tails 140 of backplane connector 100. The ground vias interconnect the ground planes of some or all of the layers of the backplane 110. In particular, the ground vias may extend through all of the layers of the backplane 110 and may be plated with a conductive material.

Each via pattern 420 of attachment layer 560 further includes shadow vias 640, 642, 644 and 646. The shadow vias 640 and 642 are located on opposite sides of signal via 610, and shadow vias 644 and 646 are located on opposite sides of signal via 612. As shown in FIG. 6, the shadow vias overlap the edges of antipad 622 and are positioned relatively closely to the respective signal vias. The shadow vias do not accept contact tails of backplane connector 100 and, in the attachment layers of backplane 110, are not plated with a conductive material. In some embodiments, for example, the shadow vias may be formed by initially forming and plating a via. The plating on that via may then be removed, such as by drilling, sequential lamination of the printed circuit board, or by any other suitable technique. In some embodiments, the plating may be removed only in the attachment layers. The plating on the vias may remain through some or all of the routing layers. Removing the plating on the shadow vias in the attachment layers effectively increases the distance between the signal vias 610 and 612 and the nearest ground structure in the attachment layers where the signal vias have a larger diameter than in the routing layer. This area of removed plating both reduces the risk of shorting, from inaccuracies in positioning signal vias relative to ground vias, and also may provide a more uniform impedance along the signal paths formed by the signal via pairs.

In particular, the removal of plating in shadow vias 640, 642, 644 and 646, such as by drilling, effectively provides air holes adjacent to signal vias 610 and 612. The air holes may increase the impedance along the signal paths and thereby improve performance.

However, removing plating from a ground via to form shadow vias removes ground structures between adjacent via patterns 420, which may enable cross talk between signal conductors in adjacent via patterns. In addition, edges of ground plane 620 adjacent the signal vias 610 and 612 are not electrically tied together. As a result, the space between ground planes near the signal vias 610 and 612 may be electrically excited by signals traveling along the vias. Excitation may generate resonance, which may spread throughout the interconnection system, creating cross talk and other problems. One or more conducting structures may extend through the printed circuit board to connect those edges of the ground planes together, substantially reducing the chance of resonance. In the illustrated embodiment, the ground planes may be connected using slot vias.

The connector footprint 410 of FIG. 6 further includes slot vias 650 positioned between adjacent via patterns 420. Slot vias 650 may have the form of an elongated hole that extends only partially through the printed circuit board, such as only through the attachment layers of the backplane 110 but does not extend through the routing layers. The slot vias 650 are located between shadow vias of adjacent via patterns 420 and may have a length that is greater than the spacing between signal vias 610 and 612. In the embodiment of FIG. 6, the slot vias 650 have a length that is roughly equal to the long dimension of the antipad 622. The slot vias 650 are plated with a conductive material and interconnect the ground planes of the attachment layers. Further, the slot vias 650 may have the incidental effect of providing electrical shielding between the signal vias of adjacent differential signal pairs. Due to the long dimension of the slot vias, plating the slot vias 650 with a conductive material is easier than the plating of circular holes of comparable width. In one non-limiting example, slot vias 650 have lengths of 3.175 mm and widths of 0.5 mm.

Figure 7:
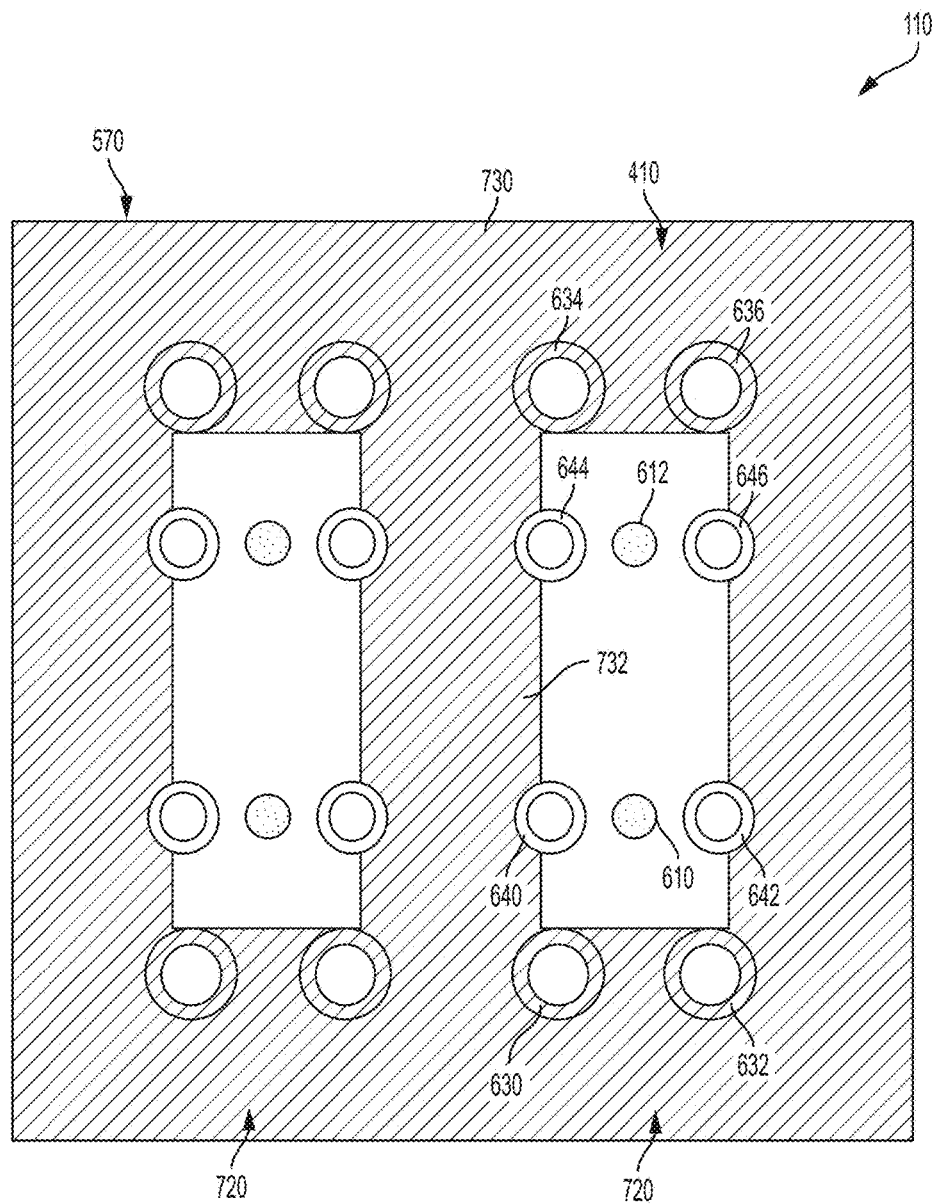
FIG. 7 is a partial top view of a routing layer of the backplane, in accordance with embodiments.

A partial top view of an embodiment of a routing layer, such as routing layer 570, of backplane 110 is shown in FIG. 7. In the case of multiple routing layers, each of the routing layers may have the same configuration, except that different electrical connections are made to the via patterns. However, in some embodiments, some of the signal vias and/or ground vias may be backdrilled, removing conductive plating close to a lower surface of the printed circuit board. Two via patterns 720 are shown in FIG. 7. It will be understood that via patterns 720 are vertically aligned under respective via patterns 420 of the pin layers. It will further be understood that the via patterns 720 are not visible in the backplane 110 after the layers of the backplane are pressed together, such that FIG. 7 may be regarded as a schematic illustration of the routing layer.

Each via pattern 720 of routing layer 570 includes signal vias 610 and 612 which extend vertically through the attachment layers and at least one of the routing layers. However, the signal vias 610 and 612 have smaller diameters in the routing layers than in the attachment layers. In particular, signal vias have a first diameter in the attachment layers and a second diameter in the routing layers, wherein the second diameter is smaller than the first diameter. The signal vias 610 and 612 can have smaller diameters in the routing layers because they are not required to accept the contact tails 140 of the backplane connector 100. In the via pattern 720, a ground plane 730 is partially removed to form an antipad 732 surrounding signal vias 610 and 612. The antipad 732 of routing layer 570 may have the same size and shape as the antipad 622 of attachment layer 560. However, this is not a requirement, as in some embodiments, the separation between the signal vias and the edges of the ground plane may be selected at each layer to provide a desired impedance or to otherwise provide desired electrical properties.

Each via pattern 720 of routing layer 570 also includes ground vias 630, 632, 634 and 636 which have the same locations and configurations as the corresponding ground vias in pin layer 560. In particular, the ground vias 630 and 632 are located at one end of the via pattern 720 adjacent signal via 610, and ground vias 634 and 636 are located at an opposite end of the via pattern 720 adjacent to signal via 612. The ground vias in the routing layers are not required to accept contact tails of the backplane connector, but may have the same diameters as the ground vias in the attachment layers. The ground vias 630, 632, 634 and 636 in the routing layers can be plated or filled with a conductive material. As noted, the ground vias typically interconnect the ground planes of all the layers of the backplane 110.

Each via pattern 720 of routing layer 570 further includes shadow vias 640, 642, 644 and 646 which extend vertically from the attachment layers. In the routing layers, the shadow vias are plated or filled with a conducting material. Because the signal vias 610 and 612 have smaller diameters in the routing layer 570, the spacing between signal vias 610 and 612 and the corresponding shadow vias is larger than in the attachment layer 560.

The slot vias 650 shown in FIG. 6 do not extend into the routing layers. This facilitates use of the routing layers for routing of signal traces to respective signal vias.

Figure 8:
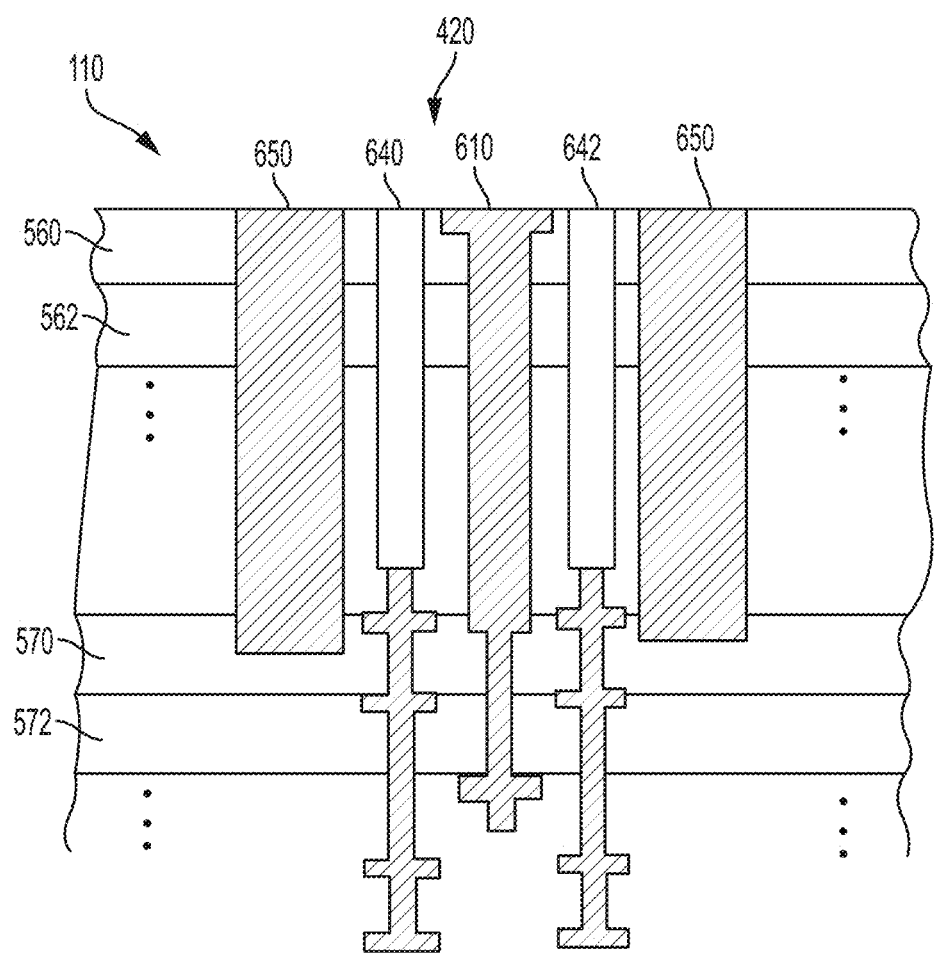
FIG. 8 is a cross-section of the backplane taken along the line 8-8 of FIG. 6, in accordance with embodiments.

A schematic cross-section of the via pattern 420 of FIGS. 6 and 7 is shown in FIG. 8. The interrelationship between the vias of via pattern 420 at different depths in backplane 110 is shown in FIG. 8. The via types are described in greater detail below. As shown, signal via 610 extends through attachment layers 560, 562, etc. and one or more of routing layers 570, 572, etc., and provides a signal connection to at least one of the routing layers. Shadow vias 640 and 642 are located on opposite sides of signal via 610 and are plated with a conductive material in the routing layers. In the embodiment of FIG. 8, shadow vias 640 and 642 are not plated with a conductive material in the attachment layers. The shadow vias 640 and 642 interconnect ground planes of the routing layers, but, in the embodiment of FIG. 8, do not interconnect ground planes of the attachment layers. The slot vias 650 are located on opposite sides of shadow vias 640 and 642 and extend through only the attachment layers 560, 562, etc. Slot vias 650 are connected to the ground planes of each of the attachment layers. As shown, the slot vias 650 and the conductive portions of shadow vias 640 and 642 share the ground plane of at least one routing layer 570.

Figure 9:
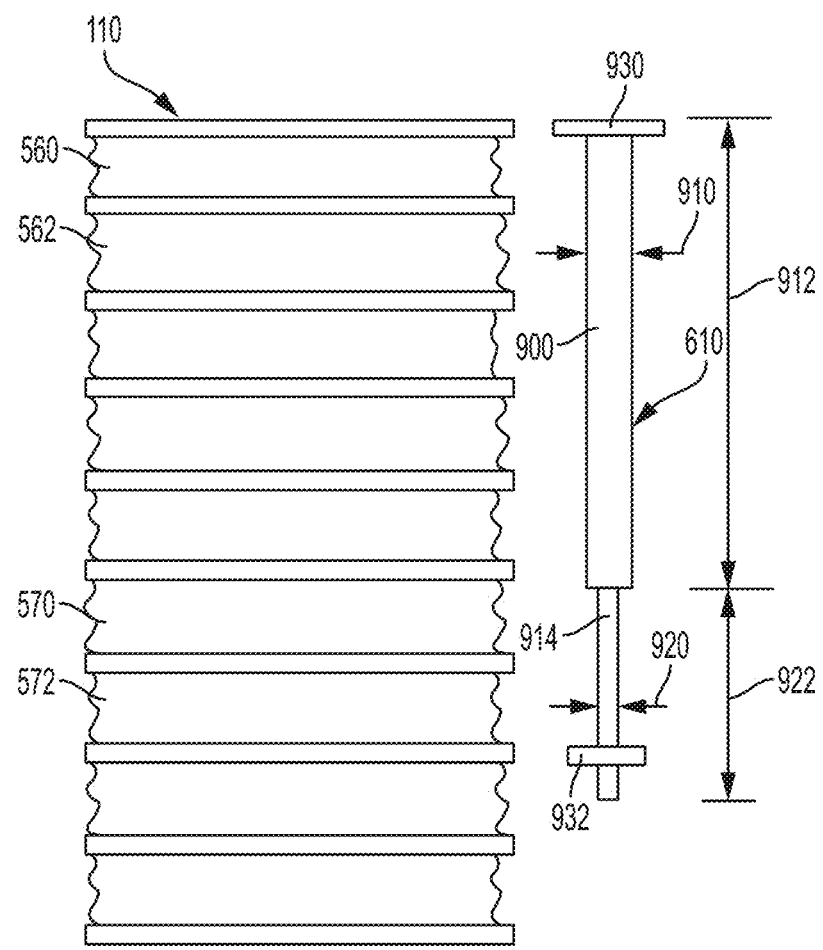
FIG. 9 is a cross-section of a signal via, in accordance with embodiments.

A schematic cross-section of an embodiment of signal via 610 is shown in FIG. 9. Signal via 612 may have the same configuration. As shown, the signal via 610 extends through the attachment layers and through at least one of the routing layers of backplane 110. Such a via may be formed by drilling a hole fully through the board, plating the via and then removing portions of the plating adjacent the lower surface of the board.

Signal via 610 has a first region 900 having a first diameter 910 and a first length 912 and a second region 914 having a second diameter 920 and a second length 922. In general, the first region 900 extends through the attachment layers and the second region 914 extends through at least one of the routing layers. The first diameter 910 is larger than the second diameter 920. As indicated previously, the first diameter 910 is selected to accept a contact tail 140 of backplane connector 100. The signal via 610 is plated with a conductive material throughout its entire length. The signal via 610 may pass through a contact pad 930 on the top layer of the backplane 110 and a contact pad 932 on the layer where the signal via is connected.

In one non-limiting example, the first diameter 910 of signal via 610 is 15.7 mils, the first distance 912 is 50 mils, the second diameter is 920 is 11 mils and the second distance 922 is 26 mils. It will be understood that these dimensions are not limiting and that other dimensions may be utilized.

Figure 10:
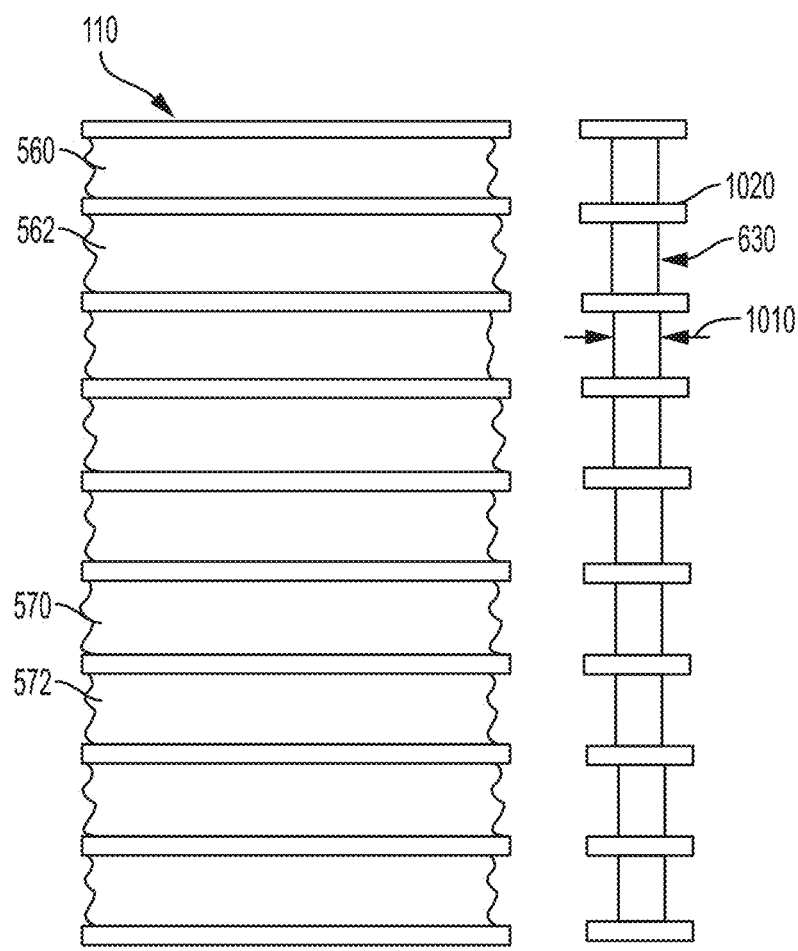
FIG. 10 is a cross-section of a ground via, in accordance with embodiments.

A schematic cross-section of an embodiment of ground via 630 is shown in FIG. 10. Ground vias 632, 634 and 636 may have the same configuration. As shown, the ground via 630 extends through the attachment layers and through the routing layers of backplane 110. In some embodiments, the ground via 630 is formed as a through hole that extends through the entire thickness of backplane 110. In the embodiment of FIG. 10, ground via 630 has a uniform diameter 1010 throughout its length. However, ground via 630 is not required to have a uniform diameter, provided that the diameter in the attachment layers of backplane 110 is sufficient to accept a contact tail of backplane connector 100. The ground via 630 includes contact pads 1020 on some or all of the attachment layers and the routing layers. In some embodiments, the ground via 630 passes through multiple ground planes, indicated by contact pads 1020 on each of the attachment layers and the routing layers.

In one non-limiting example, the ground via 630 has a diameter of 15.7 mils and includes contact pads having diameters of 25.7 mils on every ground layer. It will be understood that these dimensions are not limiting and that other dimensions may be utilized.

Figure 11:
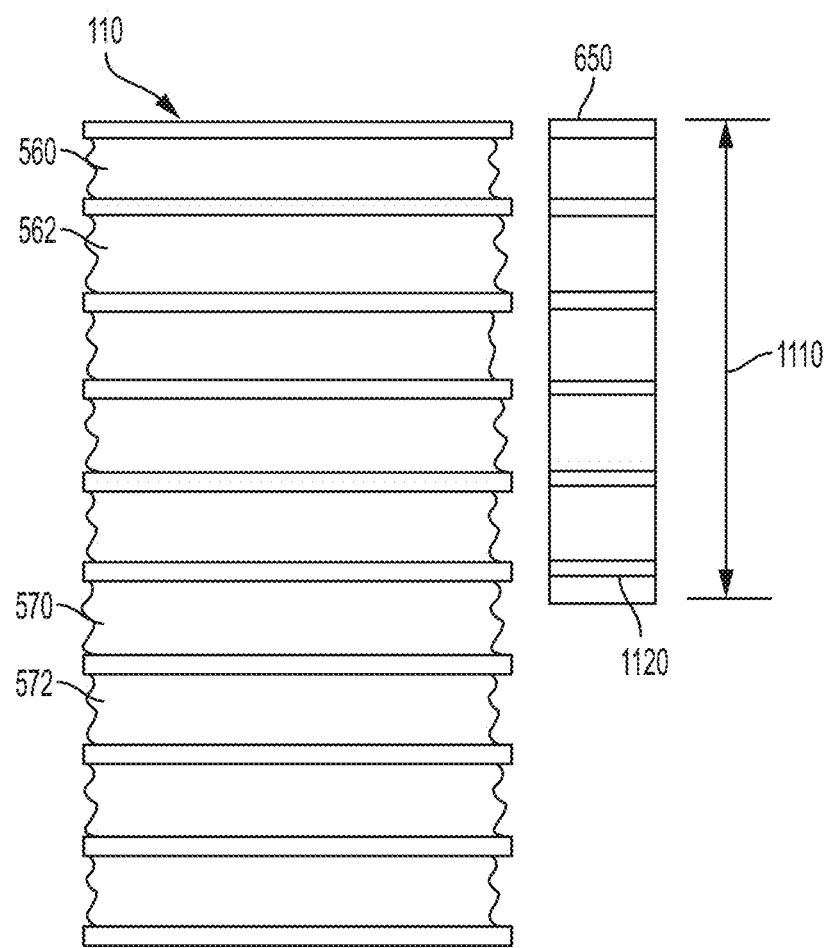
FIG. 11 is a cross-section of a slot via, in accordance with embodiments.

A schematic cross-section of an embodiment of slot via 650 is shown in FIG. 11. As shown, the slot via 650 extends through the attachment layers of backplane 110 but does not extend through the routing layers. Further, slot via 650 may be uniform in cross-section along its length 1110. The slot via 650 is not required to accept a contact tail of backplane connector 100. The slot via 650 is plated with a conductive material throughout its entire length and may be connected to the ground planes in each of the attachment layers. The slot via 650 functions as a shield between the signal vias of adjacent differential signal conductors and also interconnects the ground planes of the attachment layers. The slot via 650 may pass through and connect to ground planes, indicated by contact pads 1120 at each of the attachment layers.

In the absence of connections between the ground planes of the attachment layers, the ground planes form a "cavity" with two opposing conductive sheets that are not terminated at one end. For high frequency signals this cavity may resonate, producing undesirable results such a spreading cross talk throughout the backplane. By interconnecting the ground planes of the attachment layers, such resonance is suppressed.

The slot via 650 may be located between pairs of differential signal vias. Referring to FIG. 6, each via pattern 420 includes differential signal vias 610 and 612. The four signal vias of two adjacent signal pairs define a rectangle, with each pair forming one of two opposite sides of the rectangle. The signal vias 650 are located generally in the middle region of this rectangle between the two adjacent signal pairs, thus providing signal isolation between the two signal pairs.

The slot via 650 has a cross-section that is elongated in one direction, as shown in FIG. 6. Thus, the slot via 650 may have a cross-section in the form of an oval or a rectangle but is not limited to these shapes. As discussed below, the slot vias may have an irregular, or contoured, shape. In the example of FIG. 6, slot via 650 has an oval shape.

In one non-limiting example, slot via 650 has a length of 3.175 mm, a width of 0.50 mm and a depth of 50 mils. It will be understood that these dimensions are non-limiting and that other dimensions may be utilized.

The slot via 650 enables more efficient and reliable plating of the blind slot compared to a blind circular via due to increased circulation and replenishment of plating fluid in a blind slot having a smallest dimension equal to the diameter of the circular via. The slot via 650 provides electrical shielding between the two adjacent signal pairs in the region of the backplane 110 through which the plated slot extends. In some embodiments, a ground attachment between the connector and the backplane can be provided. The attachment can take the form of a rippled or ridged metal ground tab interferingly inserted into the slot, or another configuration such as a row of small twisted blades extending from the connector. The blades are designed to torsionally deform upon insertion into the plated slot and thus make electrical and mechanical connections to the ground conductors of the backplane 110.

Figure 12:
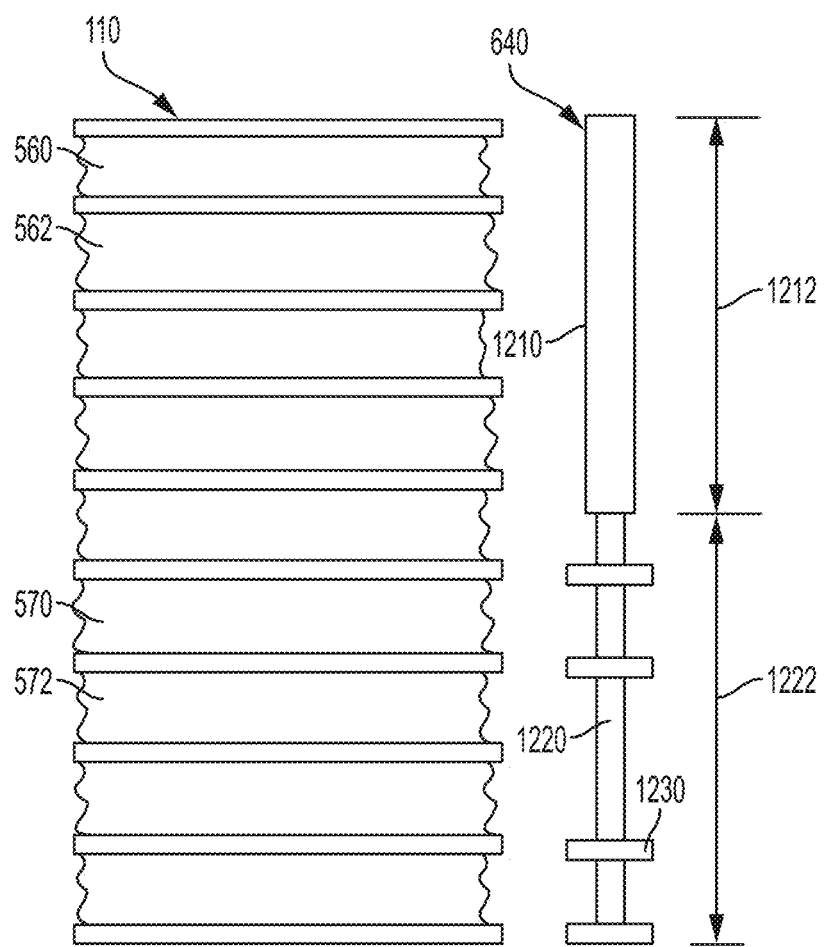
FIG. 12 is a cross-section of a shadow via, in accordance with embodiments.

A schematic cross-section of an embodiment of shadow via 640 is shown in FIG. 12. Shadow vias 642, 644 and 646 may have the same configuration. As shown, shadow via 640 extends through the attachment layers and through the routing layers of backplane 110. The shadow via 640 includes a first region 1210 having a first length 1212 and a second region 1220 having a second length 1222. The shadow via 640 may be formed as a through hole that extends through the thickness of backplane 110. However, shadow via 640 is not limited to a through hole. In the embodiment of FIG. 12, the first region 1210 of shadow via 640, which extends through the attachment layers of backplane 110, is not plated with conductive material, whereas the second region 1220 of shadow via 640 is plated with a conductive material. In some embodiments, shadow via 640 is not plated in the attachment layers, such as may result from drilling away plating after it is deposited. The depth of the non-plated first region 1210 of shadow via 640 may be somewhat less than, equal to or somewhat greater than the depth of the region 910 of signal via 610 which accepts the contact tail of backplane connector 100. Shadow via 640 is provided with contact pads 1230 which may connect to some or all ground planes in second region 1220. The shadow via 640 is not required to accept a contact tail of backplane connector 100.

In one non-limiting example, the shadow via has a diameter of 12 mils in the first region 1210. In the first region 1210 the first length 1212 is 43 mils, and in the second region 1220 the second length 1222 is 42 mils. The contact pads 1230 may have diameters of 18 mils. It will be understood that these dimensions are not limiting and that other dimensions may be utilized.

Figure 13:
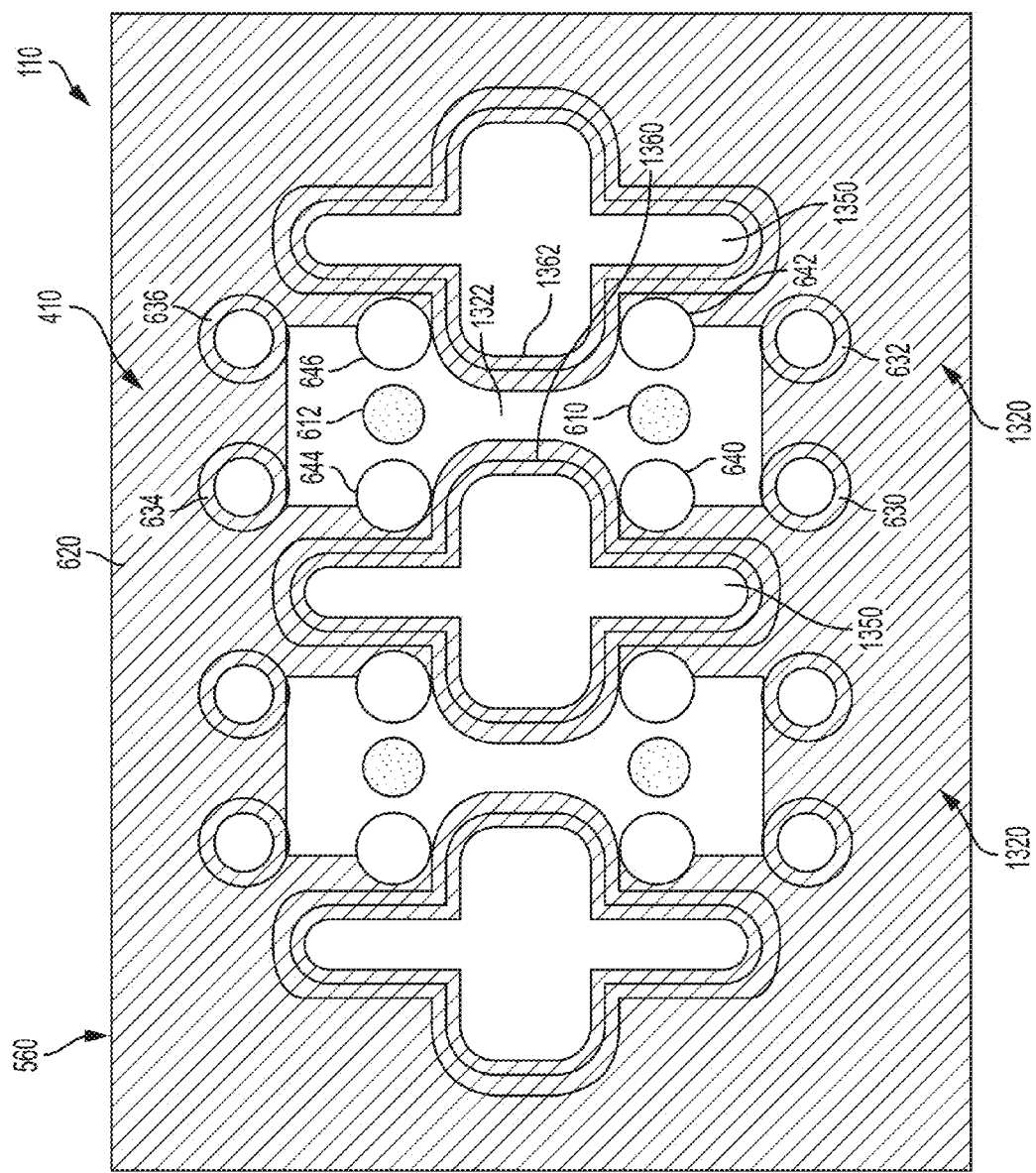
FIG. 13 is a partial top view of an attachment layer with contoured slot vias, in accordance with embodiments.

Further embodiments of a printed circuit board are described with reference to FIG. 13. A partial top view of an alternative embodiment of an attachment layer, such as attachment layer 560, is shown in FIG. 13. In the case of multiple attachment layers, each of the attachment layers of backplane 110 may have the same configuration. FIG. 13 shows two via patterns 1320 of the connector footprint 410 of backplane 110.

Each via pattern 1320 of attachment layer 560 includes signal vias 610 and 612, which form a differential signal pair, ground vias 630, 632, 634 and 636 and shadow vias 640, 642, 644 and 646. The signal vias, the ground vias and the shadow vias in FIG. 13 may correspond to the respective vias shown in FIG. 6 and described above. Accordingly, their descriptions will not be repeated. The ground plane 620 is partially removed to form an antipad 1322 surrounding signal vias 610 and 612, so that the dielectric sheet of attachment layer 560 is exposed.

The connector footprint of FIG. 13 further includes contoured slot vias 1350 positioned between adjacent via patterns 1320. Contoured slot vias 1350 may extend through the attachment layers of backplane 110, but do not extend through the routing layers. The contoured slot vias 1350 are located between shadow vias of adjacent via patterns 1320. The contoured slot vias 1350, as shown in FIG. 13, may have the form of an elongated slot with outward bumps 1360 and 1362 on opposite sides of the elongated slot. The outward bumps 1360 and 1362 may extend toward respective pairs of signal vias between pairs of shadow vias. Thus, for example, outward bump 1360 of contoured slot via 1350 extends toward signal vias 610 and 612 between shadow vias 640 and 644, and outward bump 1362 extends toward signal vias 610 and 612 between shadow vias 642 and 646. The contoured slot vias 1350 are plated with a conductive material and interconnect the ground planes of the attachment layers. Further, the contoured slot vias 1350 provide electrical shielding between the signal vias of adjacent differential signal pairs. The contoured slot vias 1350 are not limited to the cross-sectional shapes shown and described herein.

In one non-limiting example, contoured slot via 1350 has a length of 3.175 mm and a width of 0.5 mm. Outward bumps 1360 and 1362 each have a height of 0.635 mm and a width of 1.04 mm. It will be understood that these dimensions are not limiting and that other dimensions may be utilized.

Figure 14:
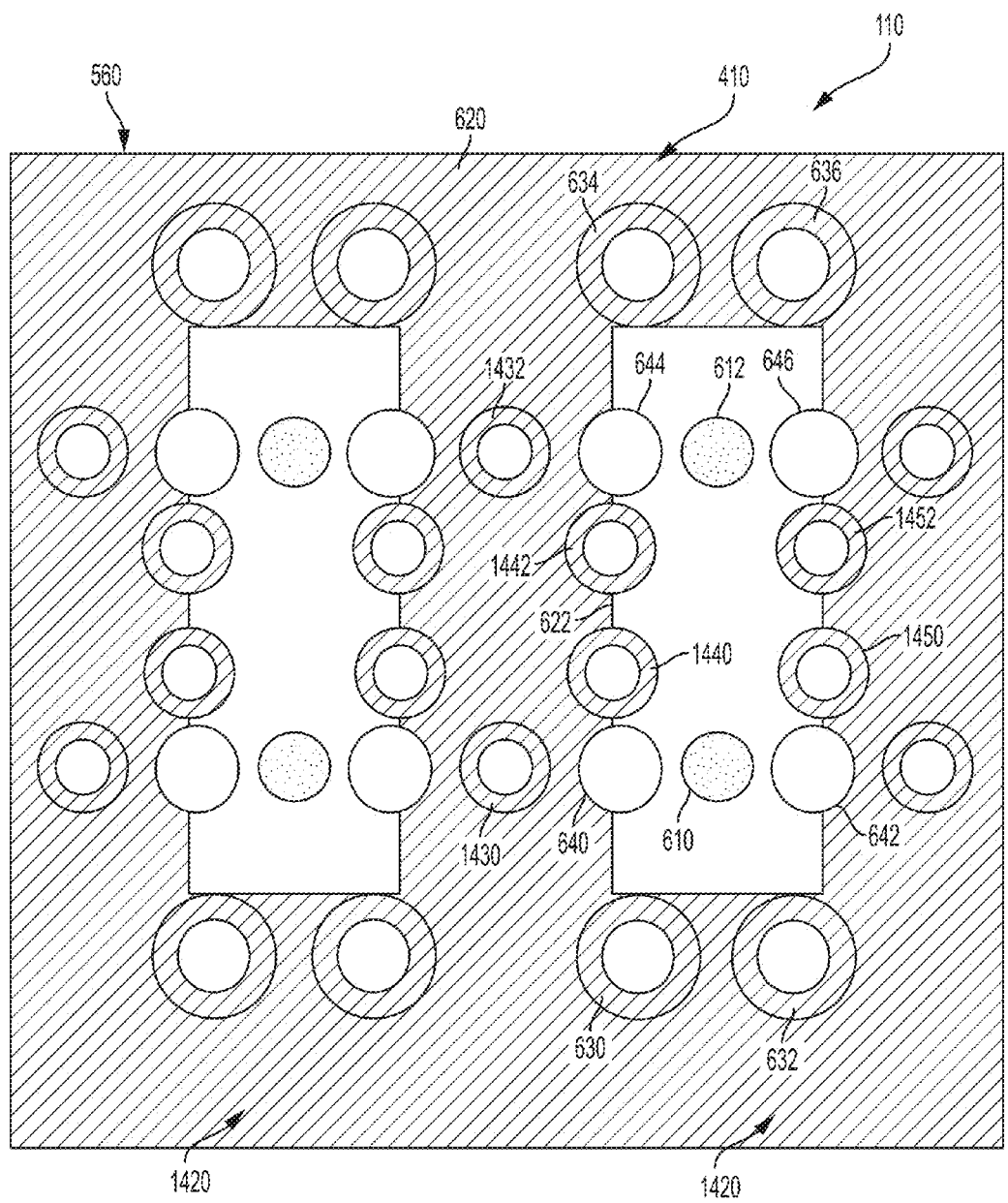
FIG. 14 is a top view of an attachment layer having a plurality of shield vias between differential pairs, in accordance with embodiments.

Further embodiments of a printed circuit board are described with reference to FIGS. 14 and 15. A partial top view of a further embodiment of an attachment layer, such as attachment layer 560, of the backplane 110 is shown in FIG. 14. In the case of multiple attachment layers, each of the attachment layers of backplane 110 may have the same configuration. FIG. 14 shows two via patterns 1420 of the connector footprint 410 of backplane connector 100.

Each via pattern 1420 of attachment layer 560 includes signal vias 610 and 612, which form a differential signal pair, ground vias 630, 632, 634 and 636, and shadow vias 640, 642, 644 and 646 as described above in connection with FIG. 6. Accordingly, the descriptions of these vias will not be repeated.

The connector footprint 410 of FIG. 14 further includes groups of blind plated vias positioned between adjacent via patterns 1420. In the embodiment of FIG. 14, blind plated vias 1430 and 1432 are located between shadow vias of adjacent via patterns 1420. In addition, blind plated vias 1440 and 1442 are located along the left side of antipad 622 between shadow vias 640 and 644; and blind plated vias 1450 and 1452 are located along the right side of antipad 622 between shadow vias 642 and 646. Thus, a group of blind-plated vias associated with each via pattern 1420 includes blind plated vias 1430, 1432, 1440, 1442, 1450 and 1452. Together, the group of blind plated vias functions similarly to slot vias 650 and contoured slot vias 1350 with respect to providing shielding between adjacent via patterns 1420 and with respect to interconnecting the ground planes of the attachment layers.

Figure 15:
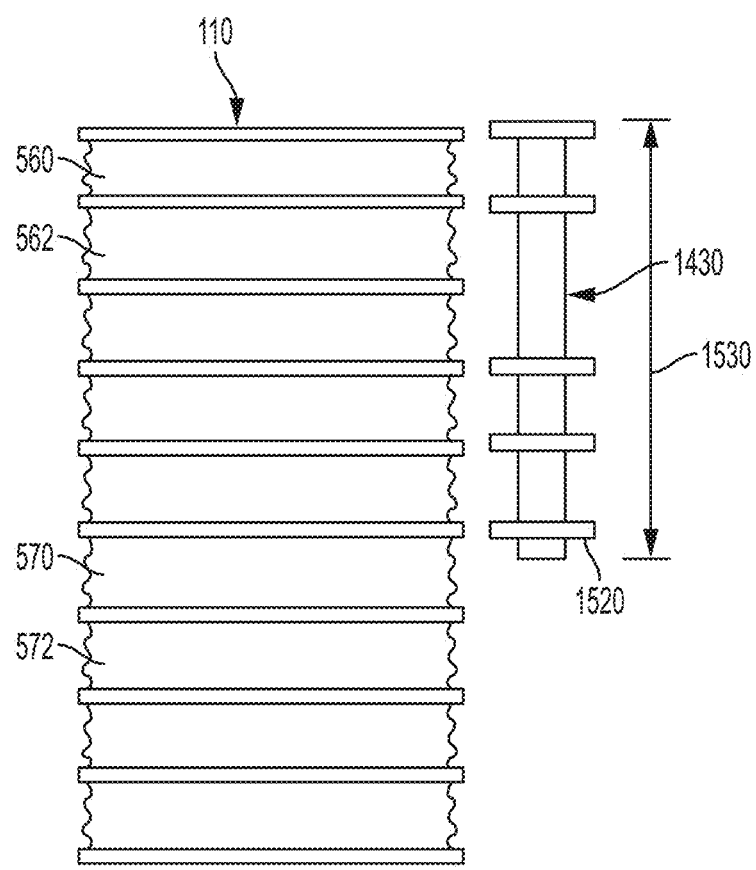
FIG. 15 is a cross-section of a shield via, in accordance with embodiments.

A schematic cross-section of an embodiment of blind plated via 1430 is shown in FIG. 15. Blind plated vias 1432, 1440, 1442, 1450 and 1452 may have the same configuration. As shown, blind plated via 1430 extends through the attachment layers of backplane 110, but does not extend through the routing layers. As with other blind vias, such a structure may be formed by drilling a hole through the board, plating the hole and then drilling away the plating where the via is not desired. However, any suitable approach may be used to form a blind via.

The blind plated via 1430 is not required to accept a contact tail of the backplane connector 100. The blind plated via 1430 may be plated with a conductive material throughout its entire length and may include one or more contact pads 1520 for connection to ground planes of the pin layers. In some embodiments, the blind plated via 1430 contacts the ground plane of every pin layer in backplane 110, as represented by pads 1520.

In one non-limiting example, the blind plated via 1430 has a diameter of 15.7 mils and a length 1530 of 50 mils. The contact pads 1520 can have diameters of 21.7 mils. It will be understood that these dimensions are not limiting and that other dimensions may be utilized.

Figure 16:
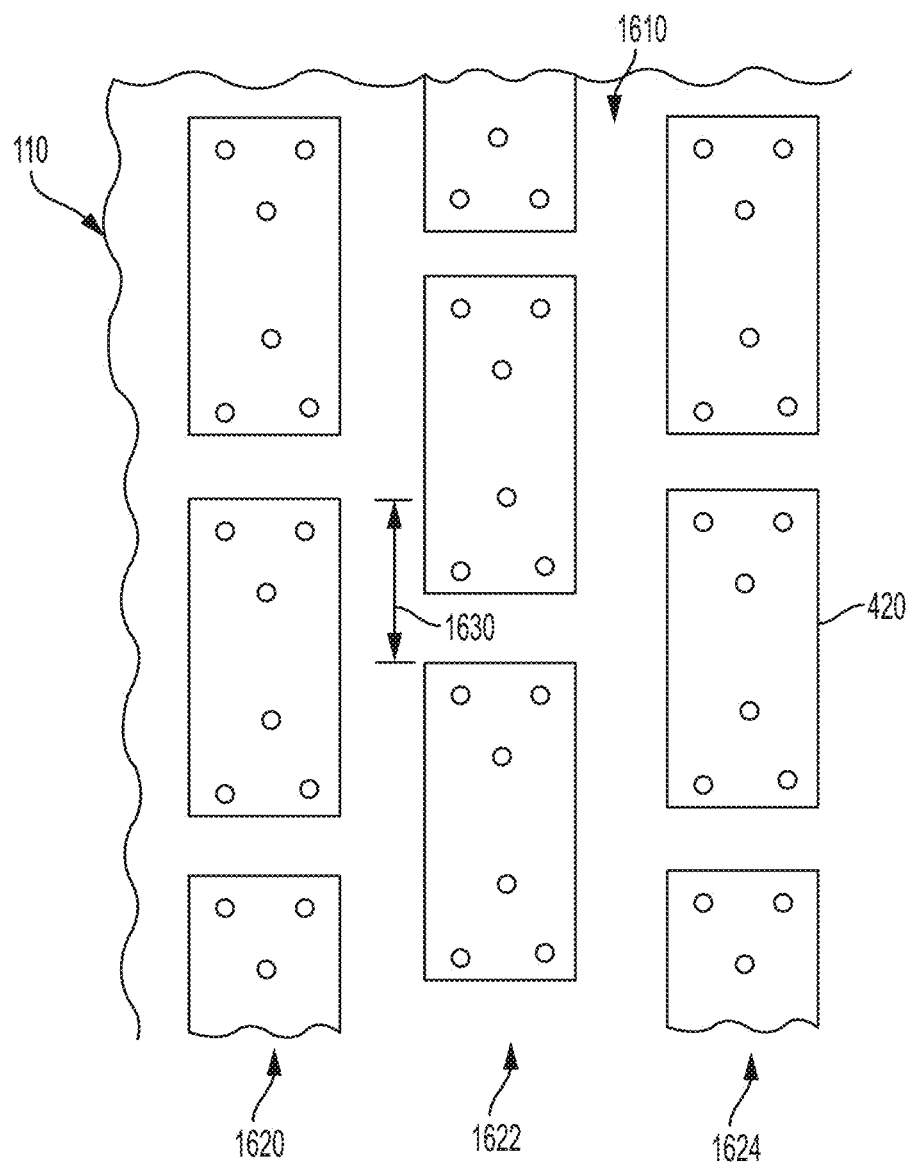
FIG. 16 is a top view of a backplane with offset signal conductors.

Further embodiments of a printed circuit board are described with reference to FIG. 16. A partial top view of an embodiment of backplane 110 showing an alternate connector footprint 1610 for mating with the contact tails of the backplane connector is shown in FIG. 16. The connector footprint 1610 includes an array of columns of via patterns 420. In the connector footprint 1610, alternating columns of via patterns 420 are offset in the column direction. In particular, a first column 1620 of via patterns 420 is offset from a second column 1622 of via patterns in the column direction by a distance 1630 which may be one half of the vertical dimension of via pattern 420. Similarly, second column 1622 of via patterns 420 may be offset from a third column 1624 of via patterns 420 by the distance 1630. The individual via patterns may correspond to the via patterns shown and described herein. In particular, the via patterns shown and described herein may be arranged according to the connector footprint 410 of FIG. 4 with non-staggered columns, the connector footprint 1610 of FIG. 16 with staggered columns, or any other suitable connector footprint.

Figure 17:
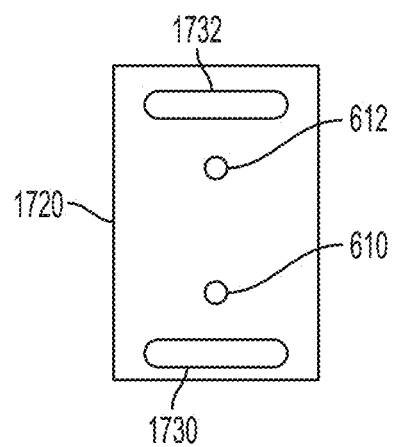
FIG. 17 is a partial top view of an attachment layer of a backplane with slots serving as ground conductors, in accordance with embodiments.

Further embodiments of a printed circuit board are described with reference to FIG. 17. An embodiment of a via pattern is shown in FIG. 17. A via pattern 1720 includes signal vias 610 and 612 as described above. The via pattern 1720 further includes ground vias 1730 and 1732 in the form of slots rather than pairs of ground vias as described above. The slot-shaped ground vias 1730 and 1732 may extend through the attachment layers and the routing layers of the backplane 110 and may connect to the ground planes of each of the attachment layers and, in some embodiments, the routing layers. Such slots may be used instead of or in addition to slots 650 or other conductive structures similarly positioned.

The contact tails of backplane connector 100 may be shaped to match the slot-shaped ground vias 1730 and 1732. In other embodiments, the contact tails of the backplane connector 100 are replaced by tabs that are inserted into the slot-shaped ground vias 1730 and 1732. The slot-shaped ground vias 1730 and 1732 provide shielding of the differential signal vias. The use of a tab, rather than two individual contact tails, distributes current more evenly. A tab that fits into a slot provides shielding even if the connector is not pressed all the way into the backplane. With separate contact tails, if the connector is not pressed all the way into the vias, there is a separation between the bottom of the shield on the connector and the top of the backplane. This does not occur with a tab pressed into a slot. Further, slot-shaped ground vias provides shielding even if a tab is not inserted into them.

Figure 18:
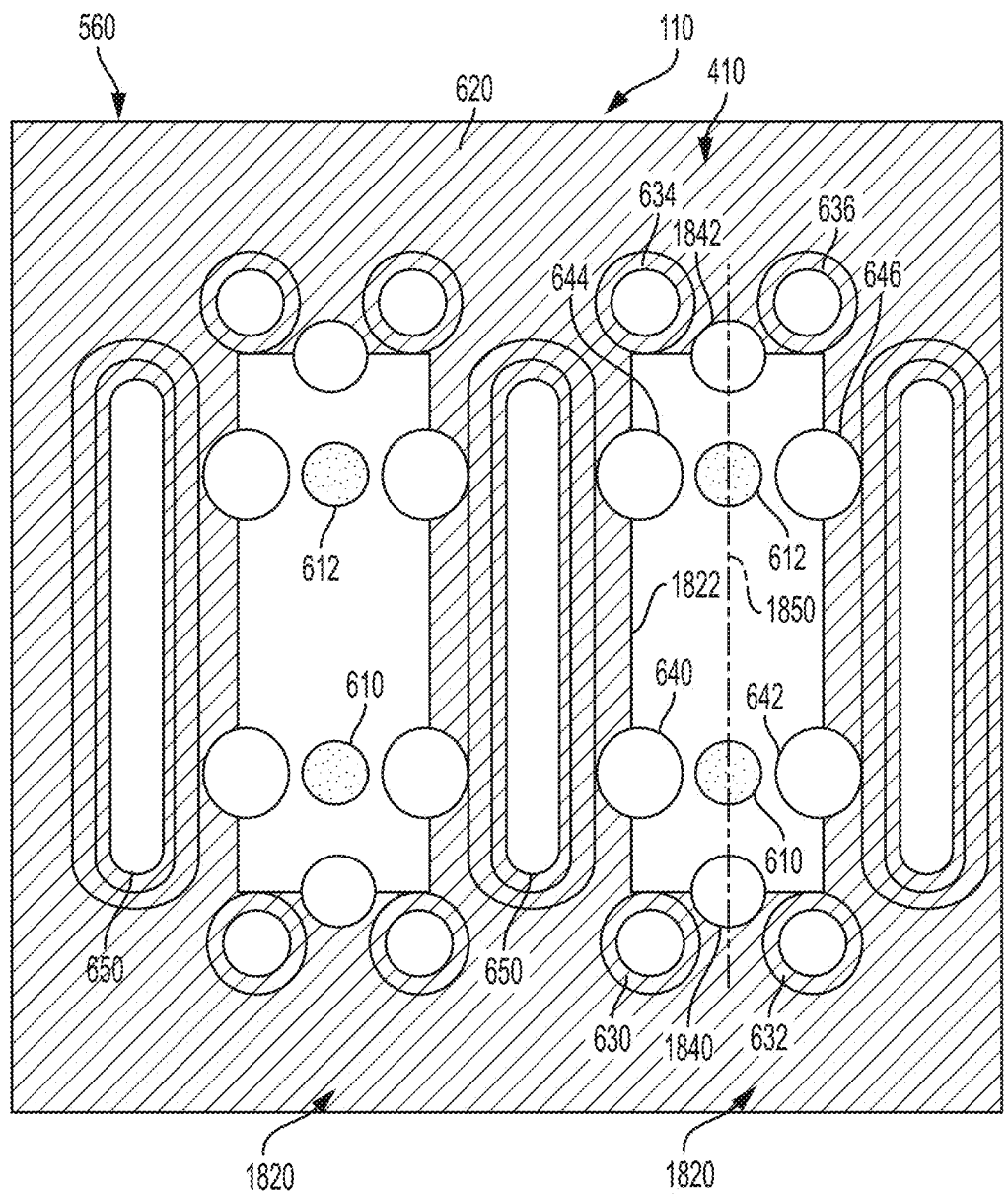
FIG. 18 is a partial top view of an attachment layer of a backplane, in accordance with embodiments.

Further embodiments of a printed circuit board are described with reference to FIGS. 18 and 19. A partial top view of an alternative embodiment of an attachment layer, such as attachment layer 560, is shown in FIG. 18. In the case of multiple attachment layers, each of the attachment layers of backplane 110 may have the same configuration. FIG. 18 shows two via patterns 1820 of the connector footprint 410 of backplane 110.

Each via pattern 1820 of attachment layer 560 includes signal vias 610 and 612, which form a differential signal pair, ground vias 630, 632, 634 and 636 and shadow vias 640, 642, 644 and 646. The signal vias, the ground vias and the shadow vias 640, 642, 644 and 646 in FIG. 18 may correspond to the respective vias shown in FIG. 6 and described above. Accordingly, their descriptions will not be repeated. The ground plane 620 is partially removed to form an antipad 1822 surrounding signal vias 610 and 612, so that the dielectric sheet of attachment layer 560 is exposed around and between signal vias 610 and 612.

Each via pattern 1820 shown in FIG. 18 further includes shadow vias 1840 and 1842 positioned adjacent to respective signal vias 610 and 620. In particular, shadow vias 1840 and 1842 may be offset in a direction of a line 1850 passing through signal vias 610 and 612. In some embodiments, shadow vias 1840 and 1842 may be located along the line 1850. More particularly, shadow via 1840 may be located between signal via 610 and ground vias 630 and 632, and shadow via 1842 may be located between signal via 612 and ground vias 634 and 636. As further shown in FIG. 18, shadow vias 1840 and 1842 may be located on the short sides of antipad 1822, approximately at the centers of the short sides thereof. Shadow vias 1840 and 1842 are not dimensioned to accept contact tails of backplane connector 100.

The shadow vias 1840 and 1842 extend through the attachment layers of backplane 110 and may extend through one or more of the routing layers. In some embodiments, the shadow vias 1840 and 1842 may extend through all of the layers of the backplane 110 and may be plated with a conductive material. In some embodiments, the shadow vias 1840 and 1842 are not plated with a conductive material in the attachment layers. In other embodiments, the shadow vias 1840 and 1842 may be plated or filled with a conductive material in the attachment layers.

The shadow vias 1840 and 1842 are disposed parallel to and in close proximity to respective signal vias 610 and 612. In some embodiments, shadow vias 1840 and 1842 may not be plated in the attachment layers, such as may result from drilling away plating after it is deposited. When plated with conductive material in the attachment layers, shadow vias 1840 and 1842 may provide a current return path for signal vias 610 and 612. When not plated in the attachment layers, the shadow vias 1840 and 1842 may provide increased clearance between the signal vias 610 and 612 and the nearest ground. The shadow vias, when drilled away, may lower the dielectric constant of the material between the signal vias 610 and 612 and the nearest ground, which may provide an increased impedance along the signal vias in the attachment layers. This increased impedance may provide better performance of the interconnection system by matching the impedance in the attachment layers to the routing layers, a connector or other portions of the interconnection system.

In one non-limiting example, shadow vias 1840 and 1842 may have the same dimensions as shadow via 640 shown in FIG. 12 and discussed above. However, the dimensions of shadow vias 1840 and 1842 are not required to be the same as those of shadow via 640. It will be understood that these dimensions are not limiting and that other dimensions may be utilized.

Figure 19:
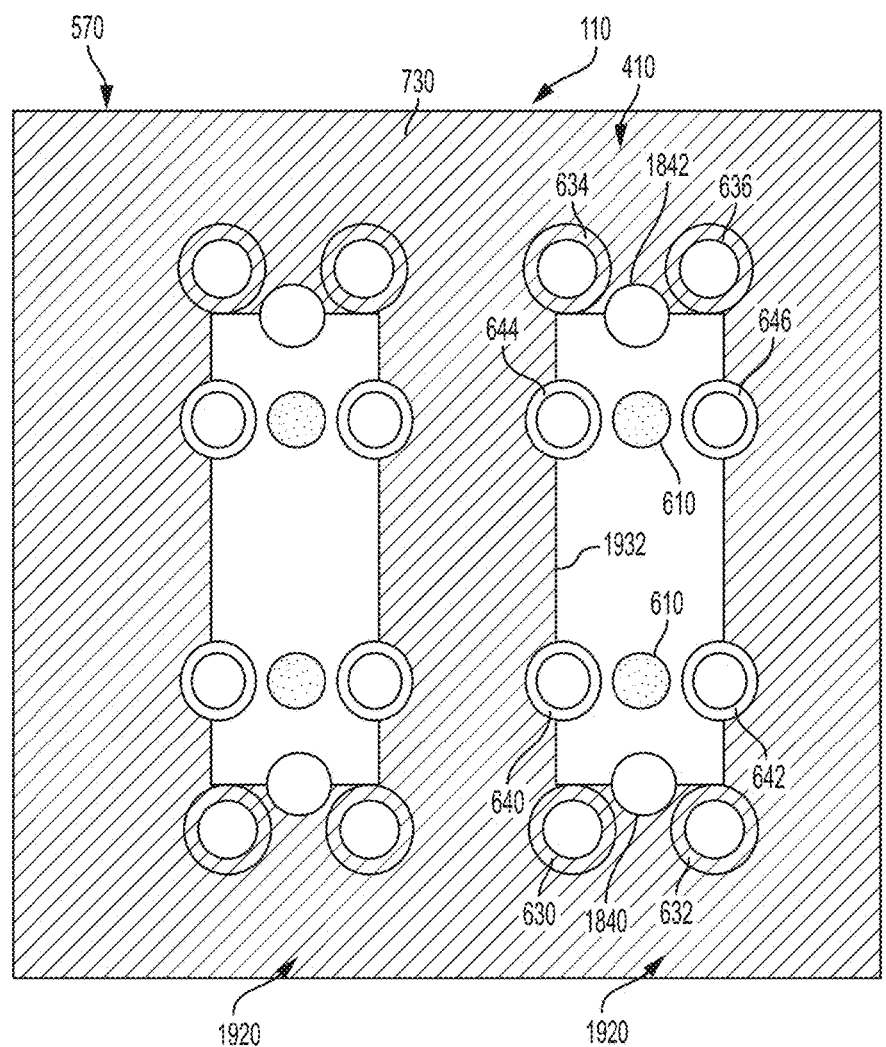
FIG. 19 is a partial top view of a routing layer of the backplane of FIG. 18, in accordance with embodiments.

A partial top view of an embodiment of a routing layer, such as routing layer 570, of backplane 110 is shown in FIG. 19. In the case of multiple routing layers, each of the routing layers may have the same configuration, except that different electrical connections are made to the via patterns. In some embodiments, some of the signal vias and/or ground vias and/or shadow vias may be backdrilled, removing conductive plating close to a lower surface of the printed circuit board.

Two via patterns 1920 are shown in FIG. 19. It will be understood that via patterns 1920 are vertically aligned under respective via patterns 1820 of the attachment layers, as shown in FIG. 18. It should be appreciated that the via patterns 1820 and the via patterns 1920 may be positioned to create the connector footprint 410 with non-staggered columns, as shown in FIG. 4, the connector footprint 1610 with staggered columns, as shown in FIG. 16, or any other suitable connector footprint. It will further be understood that the via patterns 1920 are not visible in the backplane 110 after the layers of the backplane are pressed together, such that FIG. 19 may be regarded as a schematic illustration of the routing layer.

Each via pattern 1920 of routing layer 570 includes signal vias 610 and 612 which extend vertically through the attachment layers and at least one of the routing layers. As described above, the signal vias 610 and 612 have smaller diameters in the routing layers than in the attachment layers. In each via pattern 1920, the ground plane 730 is partially removed to form an antipad 1932 surrounding and between signal vias 610 and 612. The antipads 1932 of routing layer 570 may have the same size and shape as the antipad 1822 of pin layer 560. However, this is not a requirement as discussed below.

Each via pattern 1930 of routing layer 570 also includes ground vias 630, 632, 634 and 636 which have the same locations and configurations as the corresponding ground vias in attachment layer 560. Each via pattern 1920 of routing layer 570 also includes the shadow vias 640, 642, 644 and 646 which extend vertically from the attachment layers. In the routing layers, the shadow vias may be plated or filled with a conducting material. The slot vias 650 shown in FIG. 18 do not extend into the routing layers and are not shown in FIG. 19.

Each via pattern 1920 of routing layer 570 further includes shadow vias 1840 and 1842 as described above in connection with FIG. 18. The shadow vias 1840 and 1842 extend at least to the routing layer where the signal vias 610 and 612 are connected to signal traces. The shadow vias 1840 and 1842 may extend from the routing layer where the signal vias 610 and 612 are connected to signal traces to the back side of the backplane 110, or may be backdrilled from the back side of backplane 110.

Further embodiments of a printed circuit board are described with reference to FIGS. 20 and 21. While not being bound by any particular theory of operation, the inventors have recognized and appreciated that at high frequencies, antipads around a pair of signal conductors create what can be electrically equivalent to a cavity, bounded by conductive structures, around the signal conductors. The inventors have further recognized and appreciated that coupling of signals between traces in the printed circuit and within the vias can excite resonances within that cavity. Those resonances can reduce the performance of the interconnection system including the printed circuit board. Accordingly, structuring the transition regions of the printed circuit board so as to reduce the excitation of resonant modes within that cavity may increase performance of the interconnection system.

Approaches for reducing the excitation of resonances are described below. In accordance with some embodiments, configuring ground planes in a via pattern in routing layers above and below a "breakout layer" in which traces within the printed circuit board are connected to the signal vias may reduce the risk of exciting resonant modes in the cavity.

In some embodiments, reduction in resonances may be achieved by ground structures adjacent the breakout layer extending into or toward the space between the signal vias, without entirely bridging opposing sides. Such a configuration, it is theorized, guides return current in the ground conductor in a mode transition appropriate for a transition in orientation of the conductors between signal vias and traces on the printed circuit board, which are generally oriented at right angles.

Figure 20:
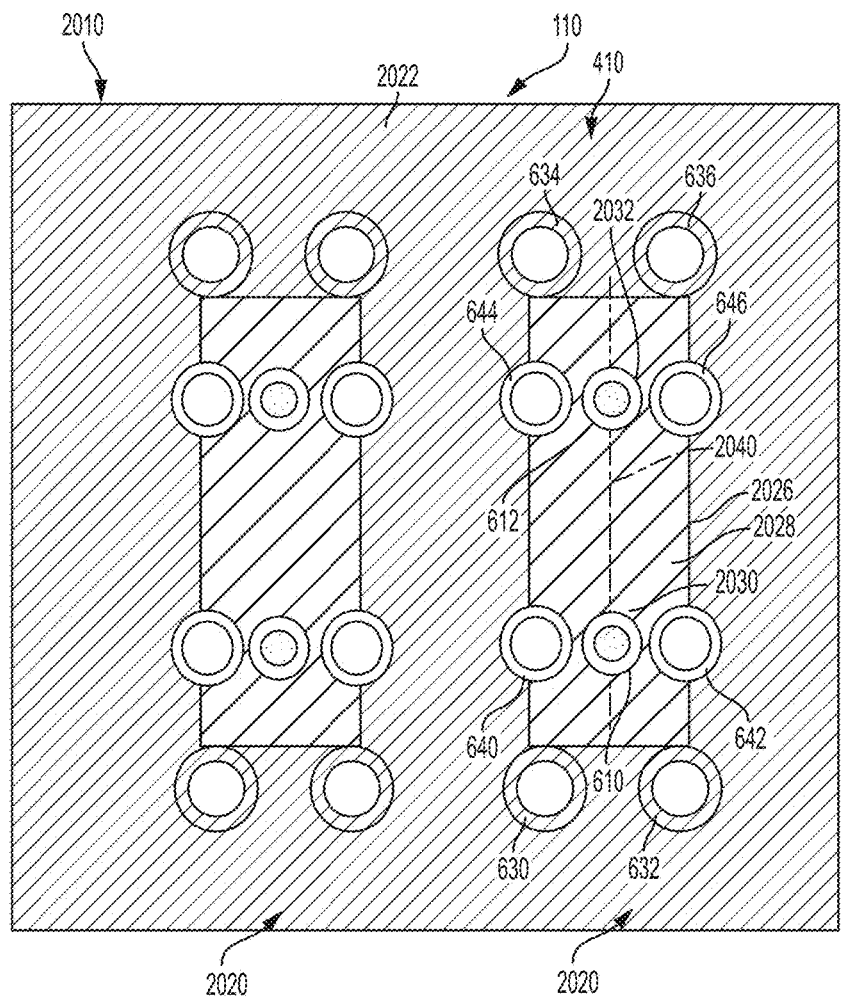
FIG. 20 is a schematic top view of a routing layer of a backplane, in accordance with embodiments.

A schematic top view, including a routing layer 2010 of backplane 110, is shown in FIG. 20. The routing layer 2010 may be the routing layer that is immediately below a breakout layer 2112 (FIG. 21) where signal via 610 is connected to a signal trace 2140. The routing layer 2010 may have a ground plane 2022. Additionally, a ground layer 2024, in a routing layer above the breakout layer 2112, is shown. In this example, an antipad 2026 in ground layer 2024 is larger than the antipads 2030 and 2032 in ground layer 2022, such that portions of ground layer 2022 are illustrated as visible through antipad 2026. The antipad 2026 is indicated by cross-hatching in FIG. 20. It should be appreciated, as with other top-down views, that only some of the structures of a printed circuit board are illustrated, omitting others so as to reveal the structures illustrated. For example, a dielectric matrix holding the conductive structures is not shown. Likewise, conductive structures on only selected layers are shown. The antipads in ground layers 2022 and 2024 are superimposed in FIG. 20 for purposes of illustration.

FIG. 20 shows two via patterns 2020 of routing layer 2010. A simplified cross-sectional view of a portion of backplane 110 corresponding to FIG. 20 is shown in FIG. 21. FIG. 21 is a cross-sectional view of the portion around signal via 610.

Each via pattern 2020 of routing layer 2010 includes signal vias 610 and 612 which extend vertically through the attachment layers and through one or more of the routing layers, including routing layer 2010 and breakout layer 2112. In each via pattern 2020, the ground plane is partially removed to form a non-conductive area, or antipad, surrounding signal vias 610 and 612. In the embodiment illustrated, the antipad 2026 is rectangular and is large enough for both signal vias 610 and 612 to pass through. In the embodiment illustrated, antipad 2026 is representative of an antipad for the signal vias 610 and 612 in ground planes of the routing layers above the breakout layer 2112. As discussed above, antipad 2026 and similar antipads in other layers of the printed circuit board define what can be electrically equivalent to a cavity. The cavity has a long dimension parallel with a line 2040 (FIG. 20) between signal vias 610 and 612.

Figure 22:
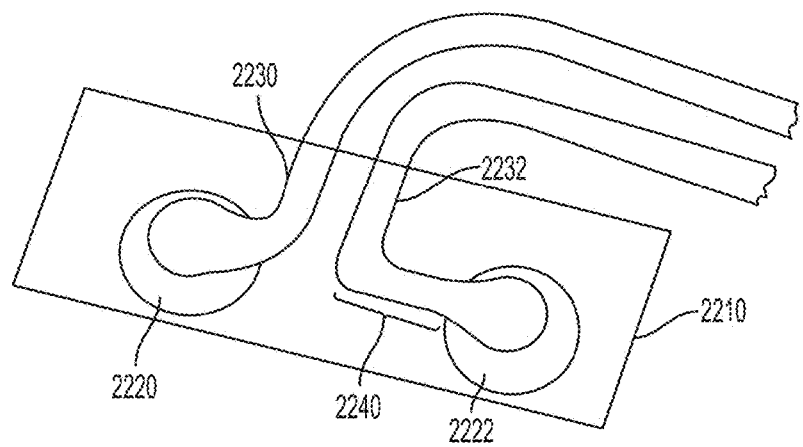
FIG. 22 is a partial top view of a routing layer of a backplane, in accordance with embodiments.

For simplicity of illustration, the traces connected to signal vias 610 and 612 are not shown in FIG. 20. However, such traces would exist in breakout layer 2112. A representative breakout layer is shown in FIG. 22, as described below. Briefly, FIG. 22 illustrates that traces on a breakout layer connect to the signal vias and then are routed to other portions of the printed circuit board as a pair.

Figure 21:
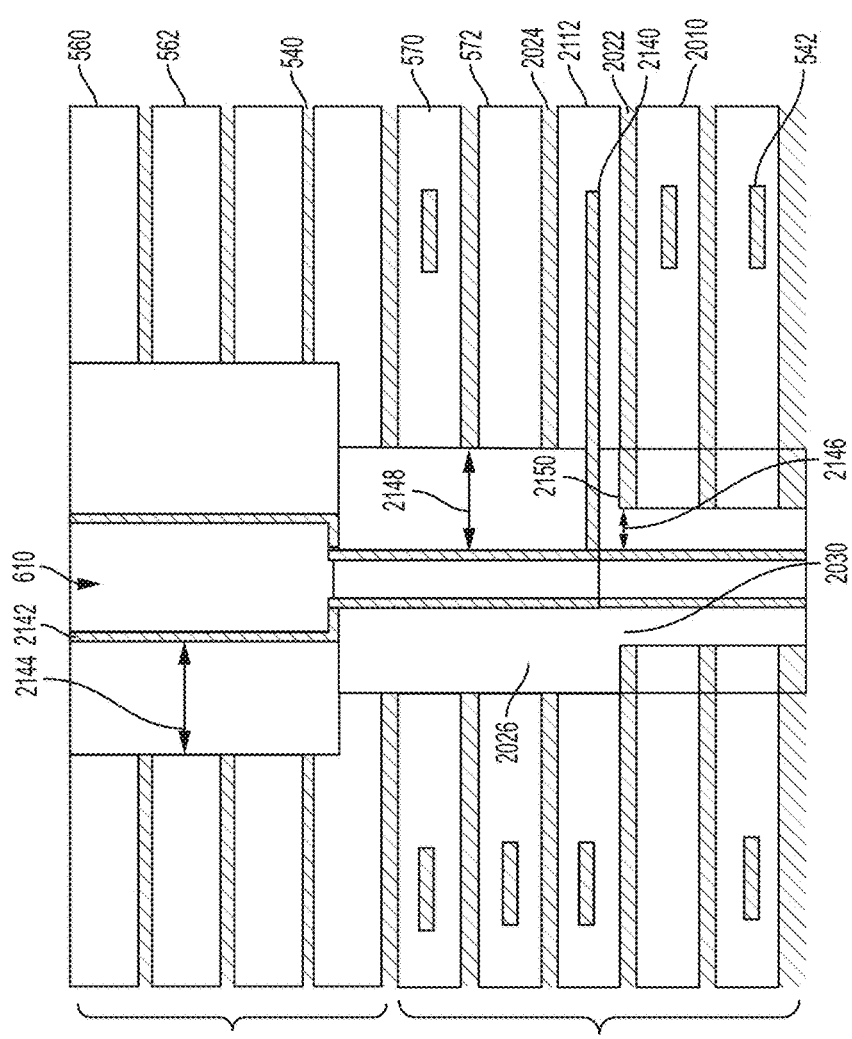
FIG. 21 is a simplified cross section of the backplane of FIG. 20, in accordance with embodiments.

The traces connected to signal vias 610 and 612 are not illustrated in FIG. 20 so as to reveal the configuration of the ground plane 2024 (FIG. 21). In the example of FIGS. 20 and 21, ground plane 2022 may also have antipads surrounding the signal vias 610 and 612, or at least openings through which the vias are drilled away in routing layers below the breakout layer. A non-conductive area, or antipad 2030, surrounding signal via 610 and a non-conductive area, or antipad 2032, surrounding signal via 612 are shown. The antipads 2030 and 2032 may be circular in shape to match the respective signal vias 610 and 612 and may have sufficient diameter to avoid contact between the ground plane 2022 and the signal vias 610 and 612, taking into account production variations in size and position. It may be noted that the ground plane 2022 remains in an area 2028 between signal vias 610 and 612, since operation as a differential signal pair is not required in routing layers below breakout layer 2112.

Each via pattern 2020 of routing layer 2010 may also include ground vias 630, 632, 634 and 636, which may have the same locations and configurations as the corresponding ground vias in the attachment layer 560, as shown in FIG. 6. Each via pattern 2020 of routing layer 2010 may also include shadow vias 640, 642, 644 and 646 which extend vertically from the attachment layers. In the routing layers, the shadow vias may be plated or filled with a conductive material. The slot vias 650 shown in FIG. 6 do not extend into the routing layers and are not shown in FIG. 20.

As shown in FIG. 21, the backplane 110 includes attachment layers 560, 562, etc. and routing layers 570, 572, 2112 and 2010, etc. The number of attachment layers and the number of routing layers in a particular backplane may vary according to application. As further shown in FIG. 21, backplane 110 may include ground planes 540 between layers of the structure and may include signal traces 542 in or between the routing layers. Signal trace 2140 in breakout layer 2112 is connected to signal via 610.

The signal via 610 includes plating 2142 in the attachment layers and in one or more of the routing layers. A ground clearance 2144 is provided between signal via 610 and the ground planes 540 in the attachment layers and in one or more of the routing layers. The ground clearance 2144 in the attachment layers corresponds to the clearance provided by antipad 622 shown in FIG. 6 and described above. The ground planes 540 are removed in the region around and between signal vias 610 and 612 to form antipads on each of the attachment layers and on each of the routing layers down to and including breakout layer 2112.

As further shown in FIG. 21, a ground clearance 2146 between ground plane 2022 of routing layer 2010 and signal via 610 corresponds to the antipad 2030 shown in FIG. 20 and described above. The ground clearance 2146 can be small in comparison with ground clearance 2144 and also can be small in comparison with a ground clearance 2148 in routing layers above the breakout layer 2112, provided that the ground plane 2022 does not contact signal via 610. As shown in FIG. 21, the signal trace 2140 is in close proximity to the ground plane 2022 in a region 2150 due to the relatively small diameter of antipad 2030.

Without being bound by any particular theory of operation, the inventors believe that the portions of ground plane 2022 remaining in area 2028 between signal vias 610 and 612 acts as a bridge that has the effect of shorting opposing walls of the cavity surrounding the signal vias 610 and 612. As can be seen in FIG. 20, that cavity is effectively rectangular and the bridge connects the long sides of the cavity. The lowest resonant frequency that can be supported by a cavity is inversely proportional to the length of the longest side of the cavity. Shorting the opposing long sides effectively halves the length of those sides, doubling the lowest resonant frequency that can be supported in the cavity at that location.

In addition, the excitation of certain other undesirable yet higher frequency resonant modes possible in the cavity may also be advantageously shorted out due to the fact that ground plane 2022 can be configured to provide a more or less complete conductive wall across the entire opening of the cavity with only two relatively small openings compared to the overall cross-sectional dimensions of the cavity. In the case where it is possible to fabricate signal vias 610 and 612 as blind vias, for example by using sequential lamination to construct the board, ground plane 2022 below the signal trace breakout could be advantageously configured with no antipad openings at all.

The additional conductive ground plane material can be thought of as doing two things that help control undesired resonances: 1) shorting out the cavity that supports the resonance, and 2) providing a path for counter-to-signal-running ground currents in the trace-to-via transition region, that can serve to cancel some of the electromagnetic fields radiated by the two traces of a signal pair, both when they either are routed coupled or separated, and both when they either are driven differentially with respect to each other or driven in common-mode fashion with respect to ground.

This bridge is adjacent the breakout layer where a signal transition from the signal vias to traces in the printed circuit board might occur. Mismatch in the coupling can excite resonances in the cavity. Bridging the long sides adjacent the breakout layer effectively doubles the lowest frequency at which the cavity will resonate. Because exciting a resonant mode in the operating frequency of the interconnection system can result in significant performance degradation, doubling the lowest frequency at which a resonant mode might occur can substantially increase the operating frequency range of the interconnection system. Accordingly, providing bridging adjacent to the breakout layer, where such resonant modes might be excited, is thought to greatly increase the operating frequency range of the interconnection system.

In the embodiment illustrated, the bridging is in a ground plane below the breakout layer. In some embodiments, such bridging material may be one or, in some embodiments, two or more layers below the routing layer immediately adjacent the breakout layer. In other embodiments, the bridging may be one or two or more layers above the breakout layer. Alternatively or additionally, in some embodiments, the bridging may be on the breakout layer. Such a configuration may be implemented, for example, with a ground structure patterned from the same conductive layer as the signal traces. That ground structure, rather than connecting to a signal via, may be connected to a ground via.

Figure 23:
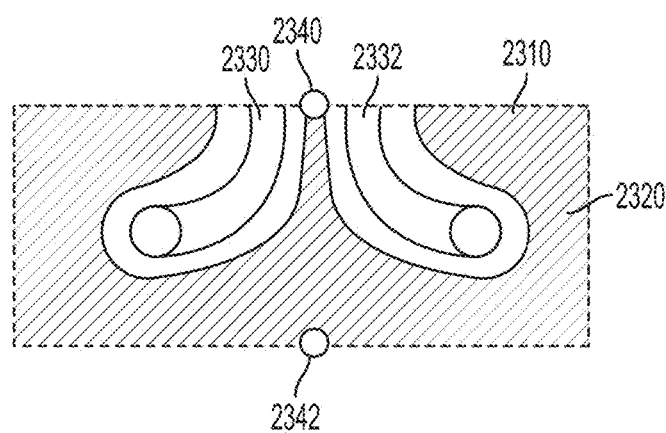
FIG. 23 is a partial top view of an illustrative breakout layer in a backplane, in accordance with embodiments.

An example of such a breakout layer is illustrated in FIG. 23. FIG. 23 illustrates a region 2310 below an antipad, which is rectangular in the illustrated embodiment, in other layers. The conductive structures illustrated in FIG. 23 may be patterned in the same conductive layer using conventional printed circuit board fabrication techniques. When formed into a printed circuit board, pads on the ends of traces 2330 and 2332 are pierced by signal vias (not shown).

A bridging region 2320 is pierced by ground vias 2340 and 2342. Ground vias 2340 and 2342 may be shadow vias or any other suitable conductive structures that connect bridging region 2320 to ground. A grounded bridging region may provide a conductive bridge between sides of the cavity, reducing resonances excited in the breakout layer in the transition of signals between traces 2330 and 2332 and the signal vias (not shown). In addition or in place of ground vias 2340 and 2342 of FIG. 23 placed as shown, it can be advantageous to have other ground vias of whatever size as is convenient in other locations around the periphery of the shaded region shown, especially with regard to the suppression of various other undesired resonant modes in the cavity.

In the embodiment illustrated in FIG. 21, a printed circuit board has antipads on ground planes in routing layers below the breakout layer that are the same. It is not a requirement that the ground planes, or the antipads around the signal pair, be the same on all routing layers. The antipads on ground planes below the breakout layer may be the same as shown in ground plane 2022 or may have any other suitable configuration.

An embodiment of a breakout layer is shown in FIG. 22. In particular, FIG. 22 shows a breakout layer 2210 having a first conductive pad 2220 connected to a signal via (not shown) and a second conductive pad 2222 connected to a second signal via (not shown). A first signal trace 2230 is connected to first conductive pad 2220 and a second signal trace 2232 is connected to second conductive pad 2222. The signal traces 2230 and 2232 may form a differential signal pair for connection of the signal vias to electrical circuitry or to other signal vias.

Depending on the routing of signal traces 2230 and 2232 between respective conductive pads 2220 and 2222 and their final destinations in breakout layer 2210, the signal traces may have different lengths. In the embodiment of FIG. 22, signal traces 2230 and 2232 bend to the right, such that signal trace 2230 would be longer than signal trace 2232 in the absence of compensation. The different lengths of the signal traces 2230 and 2232 may result in signal skew, which may produce undesired effects in the operation of the associated electrical circuitry.

It might be expected that signal traces 2230 and 2232 would be routed to the respective conductive pads 2220 and 2222 in a symmetrical manner to avoid such skew. However, the differences in the signal traces 2230 and 2232 in other portions of the routing layer 2210 may produce signal skew which can be compensated by routing the signal traces 2230 and 2232 to respective pads 2220 and 2222 in a non-symmetrical manner. As shown in FIG. 22, signal trace 2232 is routed so as to have a compensating segment 2240 that is not present in signal trace 2230. In the embodiment of FIG. 22, the compensating segment 2240 adds to the length of signal trace 2232 as compared with signal trace 2230. In other embodiments, the compensating segment is wider or narrower than the signal traces to compensate for signal skew. Thus, the width and/or the length of the compensating segment may be adjusted to compensate for signal skew. The compensating segment 2240 may compensate for the differences in the lengths, widths and/or other characteristics of signal traces 2230 and 2232 along their signal paths. It will be understood that in other situations, a compensating segment may be added to signal trace 2230 rather than to signal trace 2232.

The offset routing of the signal traces 2230 and 2232 takes advantage of the added ground plane conductive material in the region between the two signal vias of the differential pair to allow for a longer path of one of the two signal traces electrically referenced to that ground plane compared with the length of the path of the other signal trace, in order to allow for compensation of mismatch in length or delay caused by, for example, a right angle bend of the differential signal traces as they are routed into the via pattern and connected to the signal vias. The compensating segment 2240 may be located adjacent to one or more ground planes, such as ground plane 2022 in which two small (e.g. circular) antipads 2030 are formed around the signal vias, as shown in FIGS. 20 and 21. If there were no adjacent ground plane in the region between the signal vias, then the compensating segment 2240 would have a higher impedance to ground, resulting in an imbalanced pair.

The right angle bend is one way of keeping the two traces of the pair coupled uniformly to each other as long as possible, before one of them has an additional length added right before it joins the signal via. This adjustment of relative lengths of the two paired traces is performed in a region where at least one adjacent ground plane or coplanar-to-signal-traces partial ground plane can serve as a conductor of ground return currents for each of the paired traces, especially where these traces diverge and run separately from each other for some distance. In order to spread apart to join the vias that are typically spaced at least, say 1.0 mm, apart, whereas the paired traces might be typically spaced at most, say 0.3 mm apart, the two paired traces will become less electrically coupled from each other, reducing the field cancellation benefits of differential signaling, which leads to an increase in radiated fields from this transition that excite undesirable resonant modes in the cavity. However, this radiation can be reduced by configuring appropriate adjacent ground conductive paths, which support ground currents that generally run counter to the signal current direction and act to cancel a portion of the radiated fields.

Figure 24:
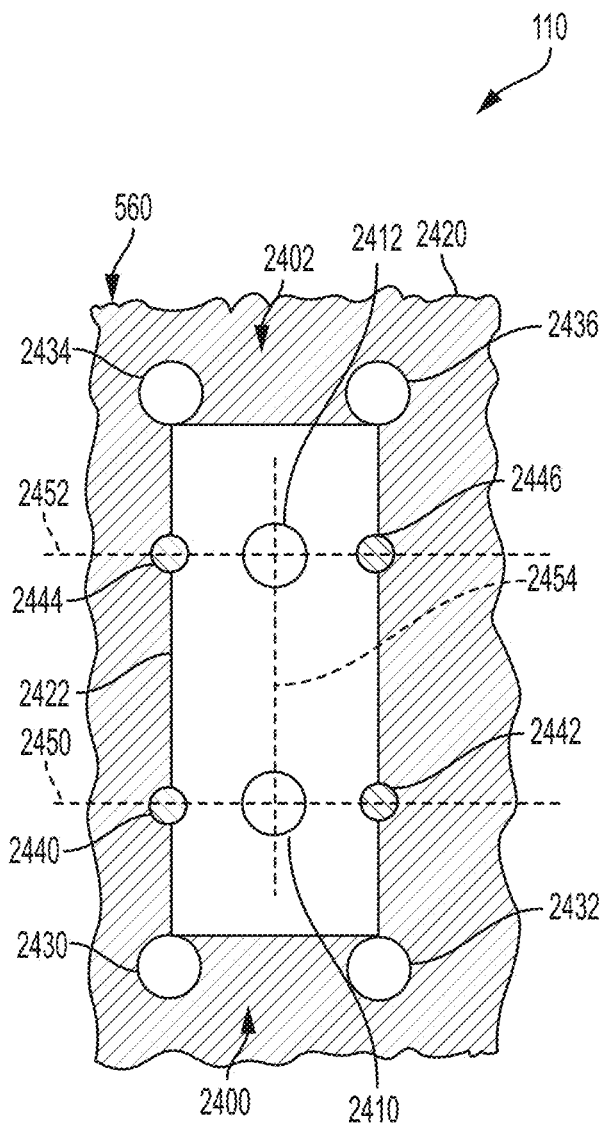
FIG. 24 is a partial top view of a via pattern in an attachment layer of a backplane, in accordance with embodiments.

Further embodiments of a printed circuit board are described with reference to FIGS. 24-27. A partial top view of an embodiment of an attachment layer, such as attachment layer 560 (FIG. 5), of the backplane 110 is shown in FIG. 24. In the case of multiple attachment layers, each of the attachment layers of backplane 110 may have the same configuration. FIG. 24 shows a via pattern 2400 of a connector footprint 2402 of backplane connector 100. A similar via pattern may be used on a daughter card, but is not expressly shown.

It should be appreciated that FIG. 24 is partially schematic in that all of the illustrated structures may not in all embodiments be seen in a visual inspection of the top of a printed circuit board. A coating may be placed over the board that obscures some of the structure. In addition, some structures may be formed on layers below the surface of the board. Those layers may nonetheless show in a top view so that the relative position of structures in the layers may be understood. For example, signal traces and ground planes may not both be visible in the same view of the board, as they are on different vertical planes within the printed circuit board. However, because the relative positioning of signal and ground structures may be important to performance of a printed circuit board, both may be shown in what is referred to as a top view.

In the example illustrated, via pattern 2400 of attachment layer 560 includes a first signal via 2410 and a second signal via 2412, which form a differential signal pair. The signal vias 2410 and 2412 extend vertically through the attachment layers and have diameters and locations in attachment layer 560 that are selected to accept the contact tails 140 of backplane connector 100. In forming the board, a ground plane 2420 is partially removed, such as by patterning a copper layer on a laminate, to form a non-conductive area, or antipad 2422, forming a ground clearance, surrounding signal vias 2410 and 2412, so that the dielectric sheet of attachment layer 560 is exposed. The areas where the ground plane is removed may be called "non-conductive areas" or "antipads." The antipad 2422 has a size and shape to preclude shorting of ground plane 2420 to signal vias 2410 and 2412, even if there is some imprecision in forming the vias relative to ground plane 2420, and to establish a desired impedance of the signal path formed by signal vias 2410 and 2412. The ground plane 2420 is removed around signal vias 2410 and 2412 and, when the signal vias form a differential signal pair, may be removed between signal vias 2410 and 2412 in some or all of the layers. In the embodiment of FIG. 24, antipad 2422 is rectangular in shape. However, it should be appreciated that antipad 2422 may have any suitable shape, including elliptical, and may have rounded corners.

Via pattern 2400 of attachment layer 560 further includes ground vias 2430, 2432, 2434 and 2436 associated with signal vias 2410 and 2412. The ground vias may be disposed around the signal vias. In this example, ground vias 2430 and 2432 may be located adjacent to one end of the via pattern 2400 and to signal via 2410, and ground vias 2434 and 2436 may be located adjacent to an opposite end of the via pattern 2400 and to signal via 2412. The ground vias 2430, 2432, 2434 and 2436 may be located more or less in proximity to the respective corners of rectangular antipad 2422. The ground vias 2430, 2432, 2434 and 2436 are dimensioned and located to accept corresponding contact tails 140 of backplane connector 100. The ground vias interconnect the ground planes of some or all of the layers of the backplane 110. In particular, the ground vias may extend through all of the layers of the backplane 110 and may be plated with a conductive material.

Each of the ground vias 2430, 2432, 2434 and 2436 may extend through the attachment layers and through the routing layers of backplane 110. In some embodiments, each ground via is formed as a through hole that extends through the entire thickness of backplane 110. Each ground via may have a uniform diameter throughout its length, but is not required to have a uniform diameter, provided that the diameter in the attachment layers of backplane 110 is sufficient to accept a contact tail of backplane connector 100. Each ground via includes contact pads on some or all of the attachment layers and the routing layers. In some embodiments, each ground via passes through multiple ground planes on the attachment layers and the routing layers.

A ground via may have any suitable diameter, such as between 12 mils and 25 mils. In one non-limiting example, each ground via has a diameter of 15.7 mils and includes contact pads having diameters of 25.7 mils on every ground layer. It will be understood that these dimensions are not limiting and that other dimensions may be utilized.

Via pattern 2400 of attachment layer 560 further includes ground shadow vias 2440, 2442, 2444 and 2446 located adjacent to signal vias 2410 and 2412. The ground shadow vias 2440 and 2442 may be located on opposite sides of signal via 2410, and shadow vias 2444 and 2446 may be located on opposite sides of signal via 2412. In the example of FIG. 24, ground shadow vias 2440 and 2442 are located along a line 2450 that passes through signal via 2410 and ground shadow vias 2444 and 2446 are located along a line 2452 that passes through signal via 2412, where lines 2450 and 2452 are perpendicular to a line 2454 that passes through signal vias 2410 and 2412. However, it will be understood that the ground shadow vias 2440, 2442, 2444 and 2446 may have other locations adjacent to signal vias 2410 and 2412. As shown in FIG. 24, the ground shadow vias overlap the edges of antipad 2422 and are positioned relatively closely to the respective signal vias. The ground shadow vias do not accept contact tails of backplane connector 100. The ground shadow vias 2440, 2442, 2444 and 2446 are discussed in greater detail below.

Figure 25:
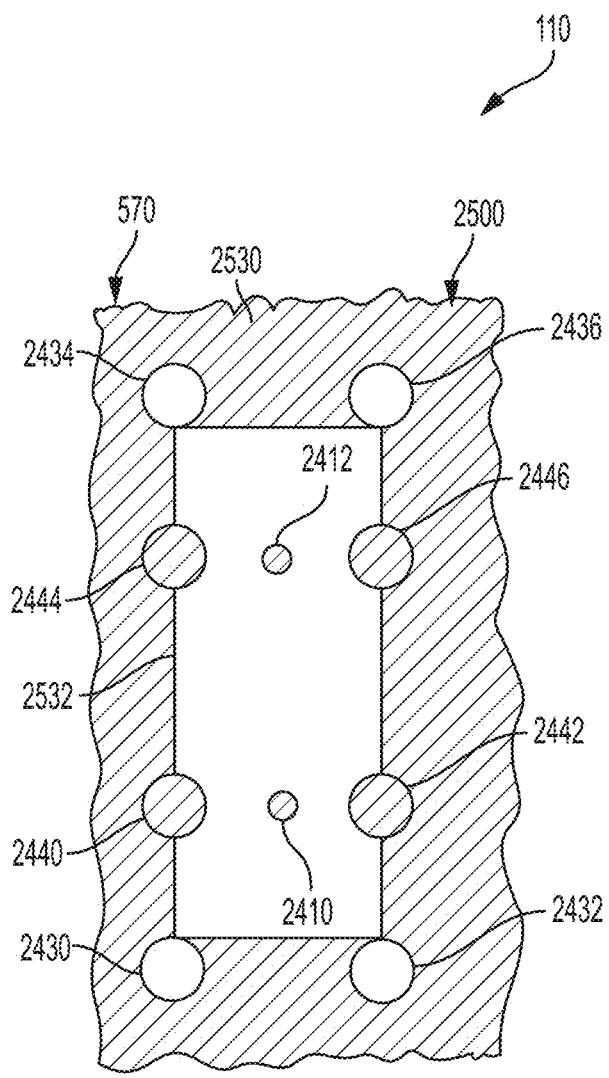
FIG. 25 is a partial top view of a via pattern in a routing layer of the backplane of FIG. 24, in accordance with embodiments.

A partial top view of an embodiment of a routing layer, such as routing layer 570 (FIG. 5), of backplane 110 is shown in FIG. 25. In the case of multiple routing layers, each of the routing layers may have the same configuration, except that different electrical connections are made to the signal vias in different via patterns. In some embodiments, some of the signal vias and/or ground vias may be back-drilled, removing conductive plating close to a lower surface of the printed circuit board. A via pattern 2500 is shown in FIG. 25. It will be understood that via pattern 2500 is vertically aligned under respective via pattern 2400 of the attachment layers. It will further be understood that the via pattern 2500 is not visible in the backplane 110 after the layers of the backplane are pressed together, such that FIG. 25 may be regarded as a schematic illustration of the routing layer.

Via pattern 2500 of routing layer 570 includes signal vias 2410 and 2412 which extend vertically through the attachment layers and at least one of the routing layers. In the embodiment of FIGS. 24 and 25, the signal vias 2410 and 2412 have smaller diameters in the routing layers than in the attachment layers. In particular, signal vias 2410 and 2412 have a first diameter in the attachment layers and a second diameter in the routing layers, wherein the second diameter is smaller than the first diameter. The signal vias 2410 and 2412 can have smaller diameters in the routing layers because they are not required to accept the contact tails 140 of the backplane connector 100, and the smaller diameters in the routing layers provide increased area for routing of signal traces to the signal vias. In the via pattern 2500, a ground plane 2530 is partially removed to form an antipad 2532 surrounding signal vias 2410 and 2412. The antipad 2532 of routing layer 570 may have the same size and shape as the antipad 2422 of attachment layer 560. However, this is not a requirement and, in some embodiments, the separation between the signal vias and the edges of the ground plane may be selected at each layer to provide a desired impedance or to otherwise provide desired electrical properties.

Via pattern 2500 of routing layer 570 also includes ground vias 2430, 2432, 2434 and 2436 which have the same locations and configurations as the corresponding ground vias in attachment layer 560. In particular, the ground vias 2430 and 2432 are located adjacent to one end of the via pattern 2500 and adjacent to signal via 2410, and ground vias 2434 and 2436 are located adjacent to an opposite end of the via pattern 2500 and adjacent to signal via 2412. The ground vias in the routing layers are not required to accept contact tails of the backplane connector, but may have the same diameters as the ground vias in the attachment layers. The ground vias 2430, 2432, 2434 and 2436 in the routing layers can be plated or filled with a conductive material. As noted, the ground vias typically interconnect the ground planes of all the layers of the backplane 110.

Via pattern 2500 of routing layer 570 further includes ground shadow vias 2440, 2442, 2444 and 2446 which extend vertically from the attachment layers. In both the attachment layers and the routing layers, the ground shadow vias are plated or filled with a conductive material. In the embodiment of FIGS. 24 and 25, the ground shadow vias 2440, 2442, 2444 and 2446 have larger diameters in the routing layers than in the attachment layers. In particular, ground shadow vias 2440, 2442, 2444 and 2446 have a first diameter in the attachment layers and a second diameter in the routing layers, wherein the second diameter is larger than the first diameter. As discussed below, the ground shadow vias are configured relative to the signal vias to provide impedance matching and shielding between adjacent differential signal pairs.

Figure 26:
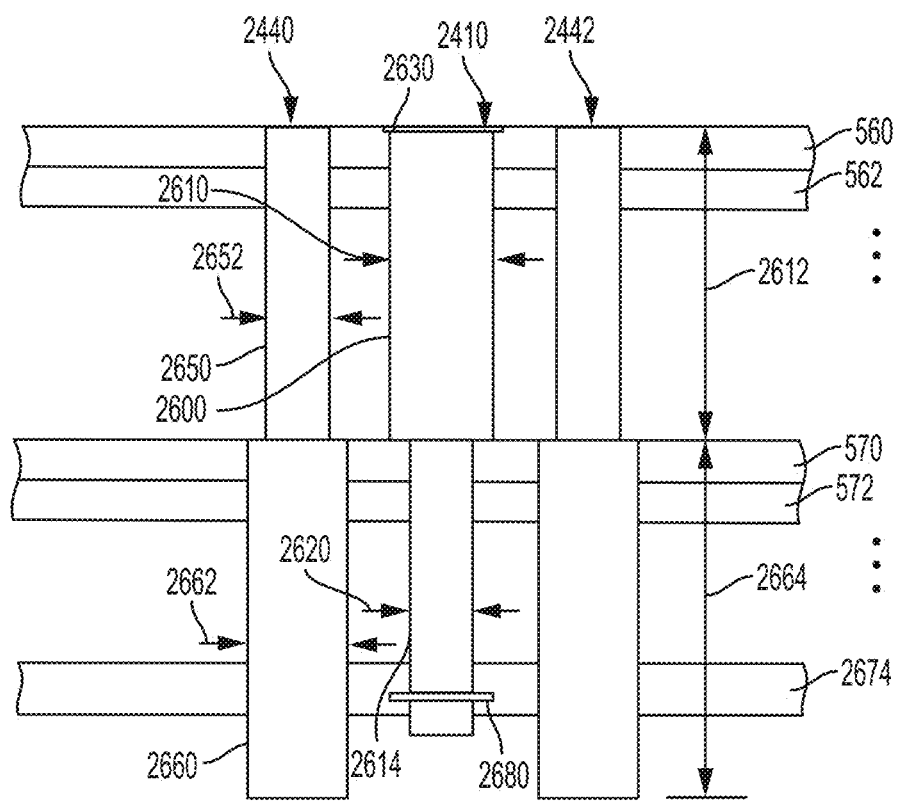
FIG. 26 is a cross-section of the via pattern of FIG. 24, in accordance with embodiments.
Figure 27:
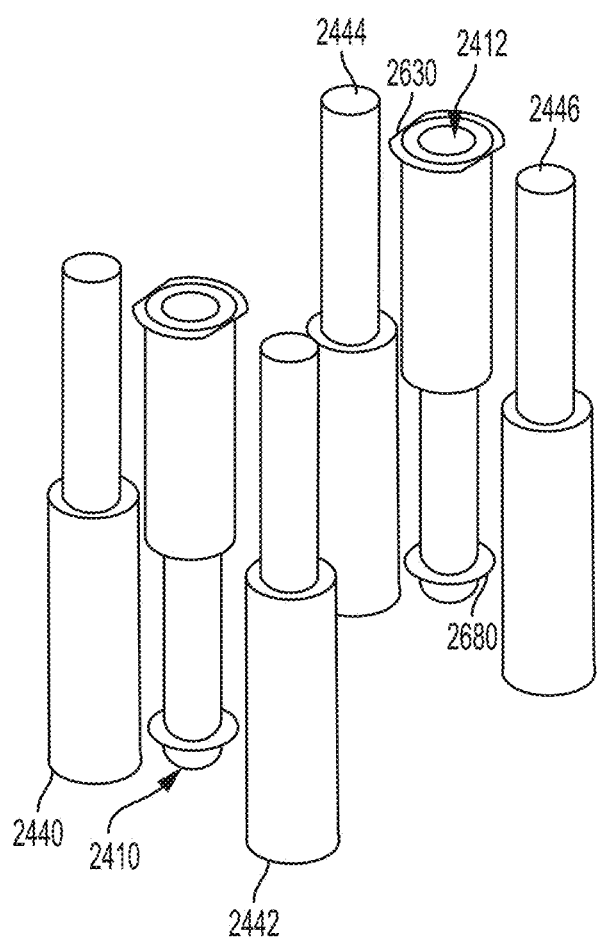
FIG. 27 is a perspective view of the via pattern of FIG. 24, in accordance with embodiments.

A schematic cross-section of the backplane 110 of FIGS. 24 and 25 is shown in FIG. 26. FIG. 27 is a perspective view of the via pattern of FIGS. 24 and 25, with the layers of backplane 110 omitted for purposes of illustration. The spatial relationship of the signal vias 2410 and 2412, and the ground shadow vias 2440, 2442, 2444 and 2446 is shown in FIG. 27.

The interrelationship between the vias of via patterns 2400 and 2500 at different depths in backplane 110 is shown in FIG. 26. As shown, signal via 2410 extends through attachment layers 560, 562, etc. and one or more of routing layers 570, 572, etc., and provides a signal connection to at least one of the routing layers, known as a "breakout layer". A breakout layer 2674 is shown in FIG. 26, with a contact pad 2680 on signal via 2410 connecting to a signal trace (not shown) on breakout layer 2674. Ground shadow vias 2440 and 2442 are located adjacent to signal via 2410 and are plated or filled with a conductive material in both the attachment layers and the routing layers. Ground shadow vias 2444 and 2446 are located adjacent to signal via 2412 and have a similar configuration. The ground shadow vias interconnect ground planes of the routing layers and the attachment layers. The ground vias 2430, 2432, 2434 and 2436 are not shown in the cross-section of FIG. 26.

As shown in FIG. 26, the signal via 2410 extends through the attachment layers and through at least one of the routing layers of backplane 110. Such a via may be formed by drilling a hole fully through the board, plating the via and then removing portions of the plating adjacent the lower surface of the board.

In the embodiment of FIG. 26, signal via 2410 has a first section 2600 having a first diameter 2610 and a first length 2612 and a second section 2614 having a second diameter 2620. In general, the first section 2600 extends through the attachment layers and the second section 2614 extends through at least one of the routing layers. The first diameter 2610 is larger than the second diameter 2620. As indicated previously, the first diameter 2610 is selected to accept a contact tail 140 of backplane connector 100. The signal via 2410 is plated with a conductive material. The signal via 2410 may have a contact pad 2630 on the top layer of the backplane 110 and contact pad 2680 on the breakout layer 2674 where the signal trace is connected.

As further shown in FIG. 26, ground shadow via 2440 extends through the attachment layers and through the routing layers of backplane 110. The ground shadow via 2440 includes a first section 2650 having a first diameter 2652 and a length 2612, and a second section 2660 having a second diameter 2662 and a second length 2664. The ground shadow via 2440 may be formed as a through hole that extends through the thickness of backplane 110. However, shadow via 2440 is not limited to a through hole. The length 2612 of the first section 2650 of ground shadow via 2440 may be somewhat less than, equal to or somewhat greater than the length of the first section 2600 of signal via 2410 which accepts the contact tail of backplane connector 100. Ground shadow via 2440 is provided with contact pads (not shown) which may connect to some or all ground planes in the attachment layers and the routing layers. The ground shadow via 2440 is not required to accept a contact tail of backplane connector 100.

In one non-limiting example, the signal vias 2410 and 2412 have dimensions where the first diameter 2610 of the first section 2600 is 14 to 16 mils and the second diameter 2620 of the second section 2614 is 10 to 12 mils. The first length 2612 of the first section 2600 may be 50 to 60 mils. The ground shadow vias may be reversed in dimensions. In particular, the first diameter 2652 of the first section 2650 is 10 to 12 mils and the second diameter 2662 of the second section 2660 is 14 to 16 mils. In some embodiments, the ground shadow vias have diameters of 6 mils. It will be understood that these dimensions are not limiting and that other dimensions may be utilized.

The signal via 2410 may be formed by drilling a through hole having the smaller second diameter 2620 entirely through backplane 110 and then drilling the first section 2600 having the larger first diameter 2610 from the front surface to a desired depth. The dual diameter hole is then plated in upper first section 2600 and is plated or filled with conductive material in lower second section 2614. The plating in the portion of signal via 2410 below the breakout layer 2674 may be drilled out to avoid undesired signal effects.

The ground shadow via 2440 may be formed by drilling a through hole having the smaller first diameter 2652 entirely through backplane 110 and then drilling the second section 2660 having the larger second diameter 2662 from the back surface to a desired depth. The ground shadow via 2440 may then be plated or filled with a conductive material through its entire length.

As noted above, the dual diameter signal via 2410 has larger first diameter 2610 selected to accept the contact tails of the mating connector. The lower second section 2614 of the signal via 2410 has smaller second diameter 2620 to provide additional space for routing of signal traces. With this arrangement, it is difficult to achieve impedance matching with current connector densities while maintaining high levels of isolation between signal vias. The dual diameter ground shadow vias 2440, 2442, 2444 and 2446 described herein provide shielding between adjacent differential signal pairs as well as impedance matching. In particular, the dual diameters of the signal vias and the ground shadow vias have a reversed diameter configuration in the attachment layers and the routing layers to provide impedance matching. In some embodiments, the larger first diameter 2610 of signal via 2410 is equal to the larger second diameter 2662 of ground shadow via 2440, and the smaller second diameter 2620 of signal via 2410 is equal to the smaller first diameter 2652 of ground shadow via 2440 to provide impedance matching. However, it should be appreciated that the dimensions need not be exact. In accordance with some embodiments, for example, the larger first diameter 2610 of signal via 2410 may be within +/−20% of the larger second diameter 2662 of ground shadow via 2440. Similarly, the smaller second diameter 2620 of signal via 2410 may be within +/−20% of the smaller first diameter 2652 of ground shadow via 2440. Further, the transitions between diameters of the signal traces and the ground shadow vias are not necessarily abrupt and do not necessarily occur at the same level in the layers of the backplane. In particular, the transitions between diameters of the signal vias 2410 and 2412 may occur at a different level in the backplane 110 than the transitions between diameters of the ground shadow vias 2440, 2442, 2444 and 2446 in order to avoid close spacing or contact between the signal vias and the ground shadow vias at the transitions (see FIG. 26).

A number of features of printed circuit boards are shown and described herein. It will be understood that the features may be utilized separately or in combination in a particular application, without departing from the scope of the present disclosure.

Having thus described at least one illustrative embodiment of the invention, various alterations, modifications and improvements will readily occur to those skilled in the art. For example, layers may be described as upper layers, or "above" or "below" other layers. It should be appreciated these terms are for ease of illustration and not a limitation on the orientation of layers. In the embodiment illustrated, "upper" refers to a direction towards a surface of a printed circuit board to which components are attached. In some embodiments, components may be attached to two sides of a printed circuit board, such that upper and lower may depend on which vias are being considered. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A printed circuit board comprising:
   a plurality of layers including attachment layers and routing layers; and
   via patterns formed in one or more of the plurality of layers, each of the via patterns comprising:
      first and second signal vias forming a differential signal pair, the first and second signal vias extending through the attachment layers and connecting to respective signal traces on a breakout layer of the routing layers;
      ground vias extending through at least the attachment layers; and
      shadow vias located adjacent to each of the signal vias and extending through the attachment layers, the shadow vias being free of conductive material in the attachment layers.

2. The printed circuit board as defined in claim 1, wherein the shadow vias extend through the attachment layers and the routing layers.

3. The printed circuit board as defined in claim 2, wherein the shadow vias include conductive material in the routing layers.

4. The printed circuit board as defined in claim 1, wherein the shadow vias are located on opposite sides of the first and second signal vias.

5. The printed circuit board as defined in claim 1, wherein the shadow vias are located on a line through the first and second signal vias.

6. The printed circuit board as defined in claim 1, wherein ground planes of the attachment layers are removed around the first and second signal vias to form antipads.

7. The printed circuit board as defined in claim 6, wherein the shadow vias are located at edges of the antipads.

8. The printed circuit board as defined in claim 1, wherein the shadow vias are located on opposite sides of the first and second signal vias and wherein additional shadow vias are located on a line through the first and second signal vias.

9. The printed circuit board as defined in claim 3, wherein the first and second signal vias are configured to accept contact tails of signal conductors of a connector and wherein the ground vias are configured to accept contact tails of ground conductors of the connector.

10. A printed circuit board comprising:
   a plurality of layers including attachment layers and routing layers; and
      via patterns formed in one or more of the plurality of layers, each of the via patterns comprising:
         first and second signal vias forming a differential signal pair, the first and second signal vias extending through the attachment layers and connecting to respective signal traces on a breakout layer of the routing layers;
         ground vias extending through at least the attachment layers; and
      ground shadow vias located adjacent to each of the signal vias and extending through the attachment layers, the ground shadow vias including ground shadow conductors that interconnect ground planes of two or more of the attachment layers.

11. The printed circuit board as defined in claim 10, wherein the ground shadow vias extend through the attachment layers and the routing layers.

12. The printed circuit board as defined in claim 10, wherein the ground shadow vias are plated or filled with conductive material at least in the attachment layers.

13. The printed circuit board as defined in claim 10, wherein the ground shadow vias are located on opposite sides of the first and second signal vias.

14. The printed circuit board as defined in claim 10, wherein the ground shadow vias are located on a line through the first and second signal vias.

15. The printed circuit board as defined in claim 10, wherein ground planes of the attachment layers are removed around the first and second signal vias to form antipads.

16. The printed circuit board as defined in claim 15, wherein the ground shadow vias are located at edges of the antipads.

17. The printed circuit board as defined in claim 10, wherein the ground shadow vias are located on opposite sides of the first and second signal vias and wherein additional ground shadow vias are located on a line through the first and second signal vias.

18. A printed circuit board comprising:
   a plurality of layers including conductive layers separated by dielectric layers; and
   via patterns formed in one or more of the plurality of layers, each of the via patterns comprising:
      first and second signal vias forming a differential signal pair, the first and second signal vias extending through one or more of the plurality of layers and connecting to respective signal traces on a breakout layer of the plurality of layers;
      ground vias extending through one or more of the plurality of layers; and
      shadow vias located adjacent to each of the signal vias and extending through one or more of the plurality of layers.

19. The printed circuit board as defined in claim 18, wherein the shadow vias are free of conductive material at least in the layers above the breakout layer.

20. The printed circuit board as defined in claim 18, wherein the ground shadow vias include ground shadow conductors that interconnect ground planes of two or more of the plurality of layers.

* * * * *